US 12,193,223 B2

(12) United States Patent
Chang et al.

(10) Patent No.: US 12,193,223 B2
(45) Date of Patent: Jan. 7, 2025

(54) MEMORY DEVICE WITH IMPROVED ANTI-FUSE READ CURRENT

(71) Applicant: TAIWAN SEMICONDUCTOR MANUFACTURING COMPANY, LTD., Hsinchu (TW)

(72) Inventors: Meng-Sheng Chang, Hsinchu (TW); Chia-En Huang, Hsinchu (TW); Yao-Jen Yang, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,638

(22) Filed: Aug. 10, 2023

(65) Prior Publication Data

US 2023/0389304 A1    Nov. 30, 2023

Related U.S. Application Data

(62) Division of application No. 17/103,073, filed on Nov. 24, 2020.

(Continued)

(51) Int. Cl.
*H01L 23/528* (2006.01)
*G06F 30/392* (2020.01)
*H10B 20/20* (2023.01)

(52) U.S. Cl.
CPC .......... *H10B 20/20* (2023.02); *G06F 30/392* (2020.01); *H01L 23/528* (2013.01)

(58) Field of Classification Search
None
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |

(Continued)

FOREIGN PATENT DOCUMENTS

| DE | 102019101570 | 8/2019 |
| DE | 102019118095 | 3/2020 |

(Continued)

OTHER PUBLICATIONS

Office Action dated Nov. 29, 2021 for corresponding application No. TW 11021171760. (pp. 1-4).

(Continued)

*Primary Examiner* — Hrayr A Sayadian
(74) *Attorney, Agent, or Firm* — Hauptman Ham, LLP

(57) ABSTRACT

A memory device includes a first programming gate-strip for a first anti-fuse structure and a second programming gate-strip for a second anti-fuse structure. In the memory device, a terminal conductor overlies a terminal region between the channel regions of a first transistor and a second transistor. The memory device also includes a group of first programming conducting and a group of second programming conducting lines. The first programming conducting lines are conductively connected to the first programming gate-strip through a first group of one or more gate via-connectors. The second programming conducting lines are conductively connected to the second programming gate-strip through a second group of one or more gate via-connectors.

21 Claims, 20 Drawing Sheets

Related U.S. Application Data

(60) Provisional application No. 63/034,657, filed on Jun. 4, 2020.

(56) References Cited

U.S. PATENT DOCUMENTS

| | | | |
|---|---|---|---|
| 2009/0316466 A1 | 12/2009 | Xu et al. | |
| 2010/0181600 A1* | 7/2010 | Law | G06F 30/30 |
| | | | 257/E27.06 |
| 2012/0182802 A1* | 7/2012 | Hung | G11C 17/16 |
| | | | 365/185.11 |
| 2013/0051133 A1 | 2/2013 | Son et al. | |
| 2013/0270626 A1* | 10/2013 | Lue | G11C 5/06 |
| | | | 257/324 |
| 2014/0040838 A1 | 2/2014 | Liu et al. | |
| 2014/0231954 A1* | 8/2014 | Lue | H10B 41/35 |
| | | | 257/528 |
| 2015/0278429 A1 | 10/2015 | Chang | |
| 2017/0154686 A1 | 6/2017 | Liaw et al. | |
| 2018/0114582 A1 | 4/2018 | Horch et al. | |
| 2019/0251223 A1 | 8/2019 | Chang et al. | |
| 2020/0051651 A1 | 2/2020 | Hoang | |
| 2020/0075610 A1 | 3/2020 | Wu et al. | |
| 2021/0089702 A1 | 3/2021 | Chien et al. | |

FOREIGN PATENT DOCUMENTS

| | | |
|---|---|---|
| DE | 102019121157 | 3/2020 |
| KR | 20170063325 | 6/2017 |
| KR | 20200026730 | 3/2020 |
| TW | 201941089 A | 10/2019 |

OTHER PUBLICATIONS

Office Action dated Dec. 17, 2021 for corresponding case No. KR 10-2021-0006617. (pp. 1-5).

* cited by examiner

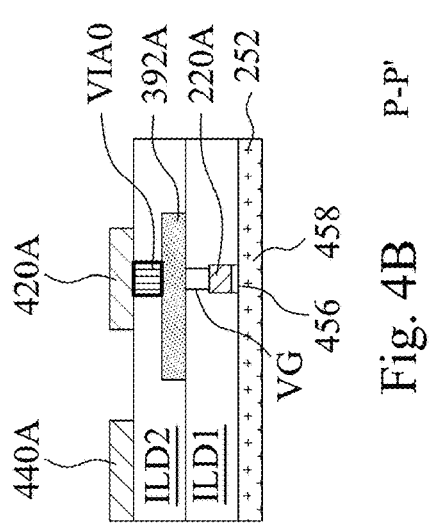
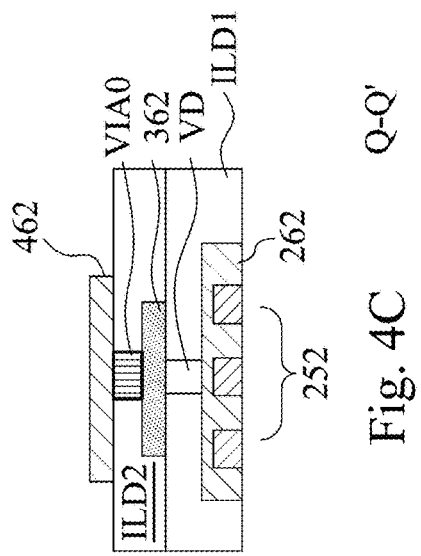
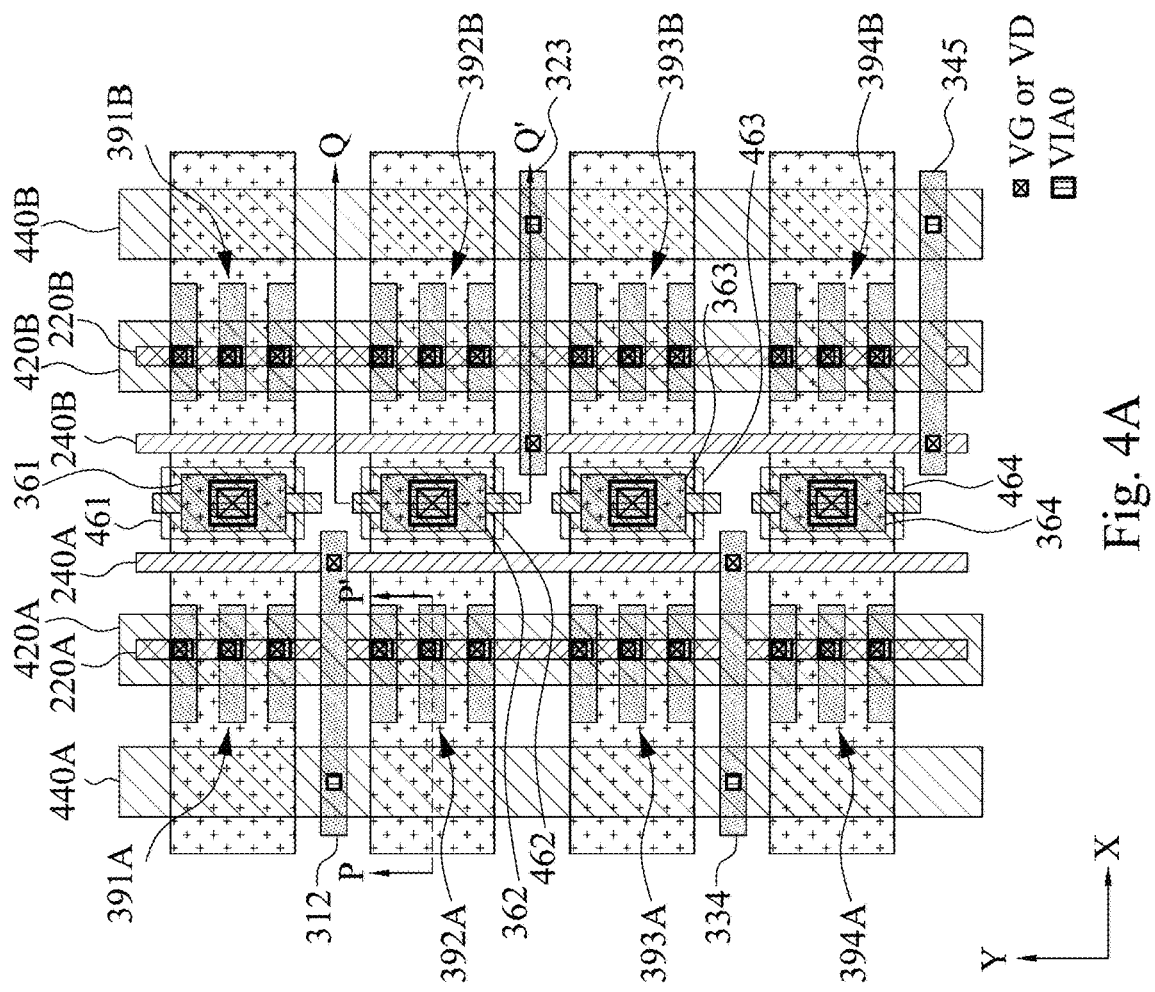
Fig. 4B
Fig. 4C
Fig. 4A

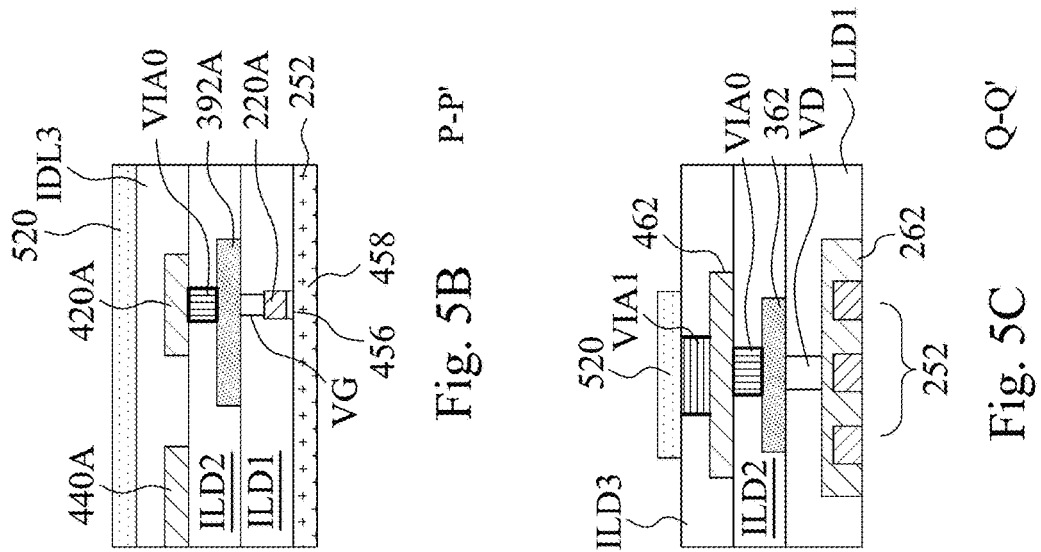
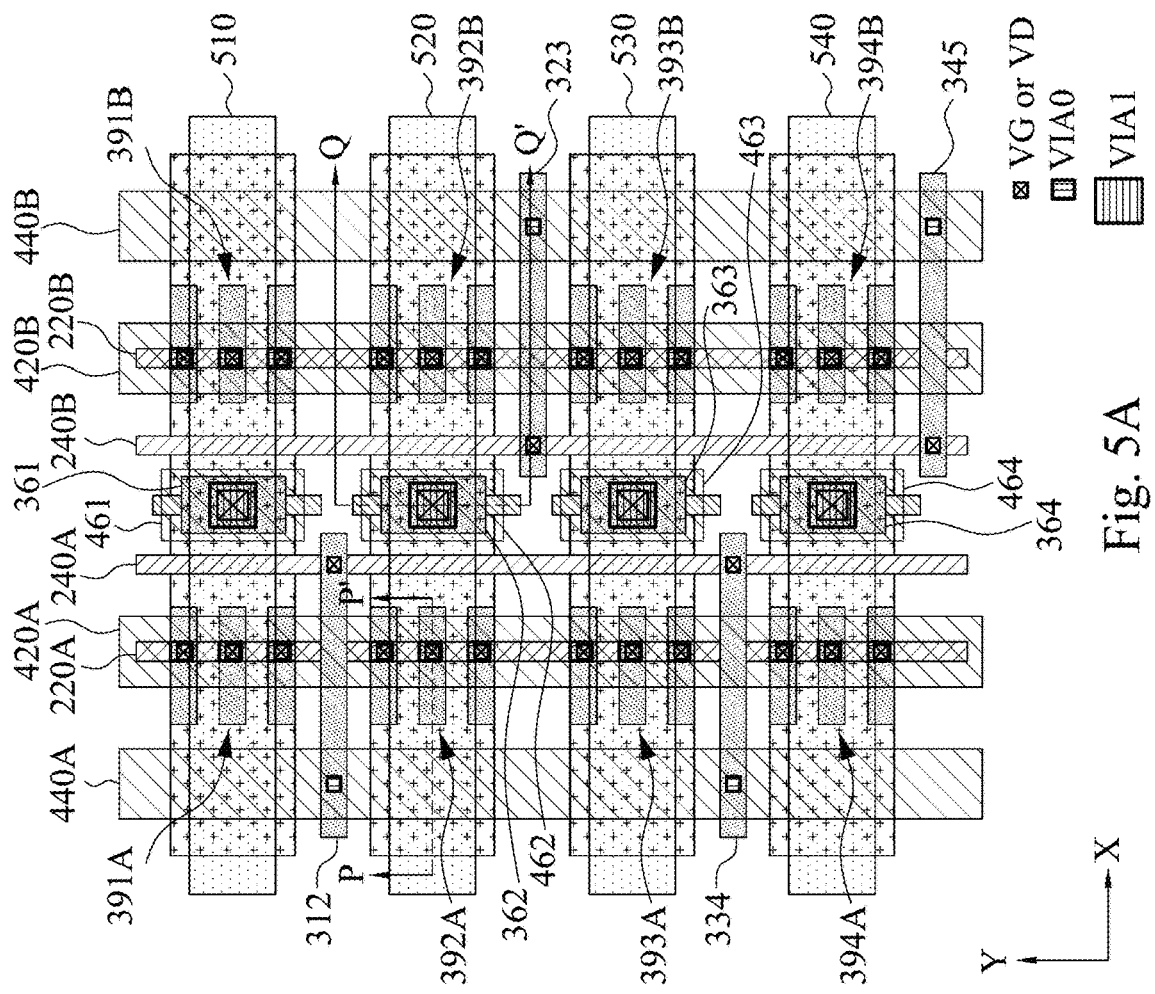
Fig. 5A  Fig. 5B  Fig. 5C

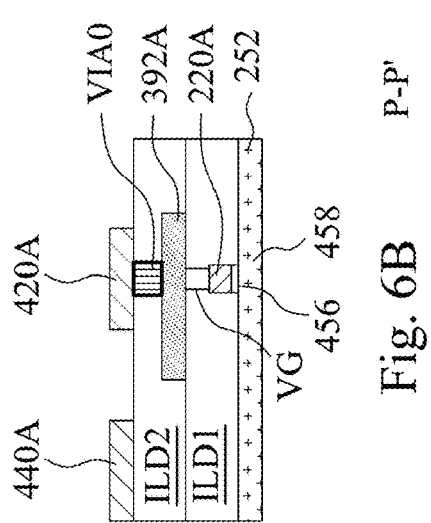
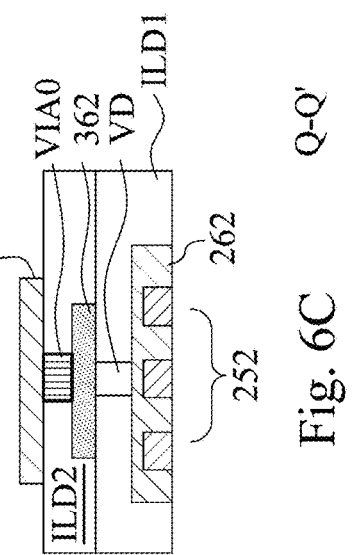
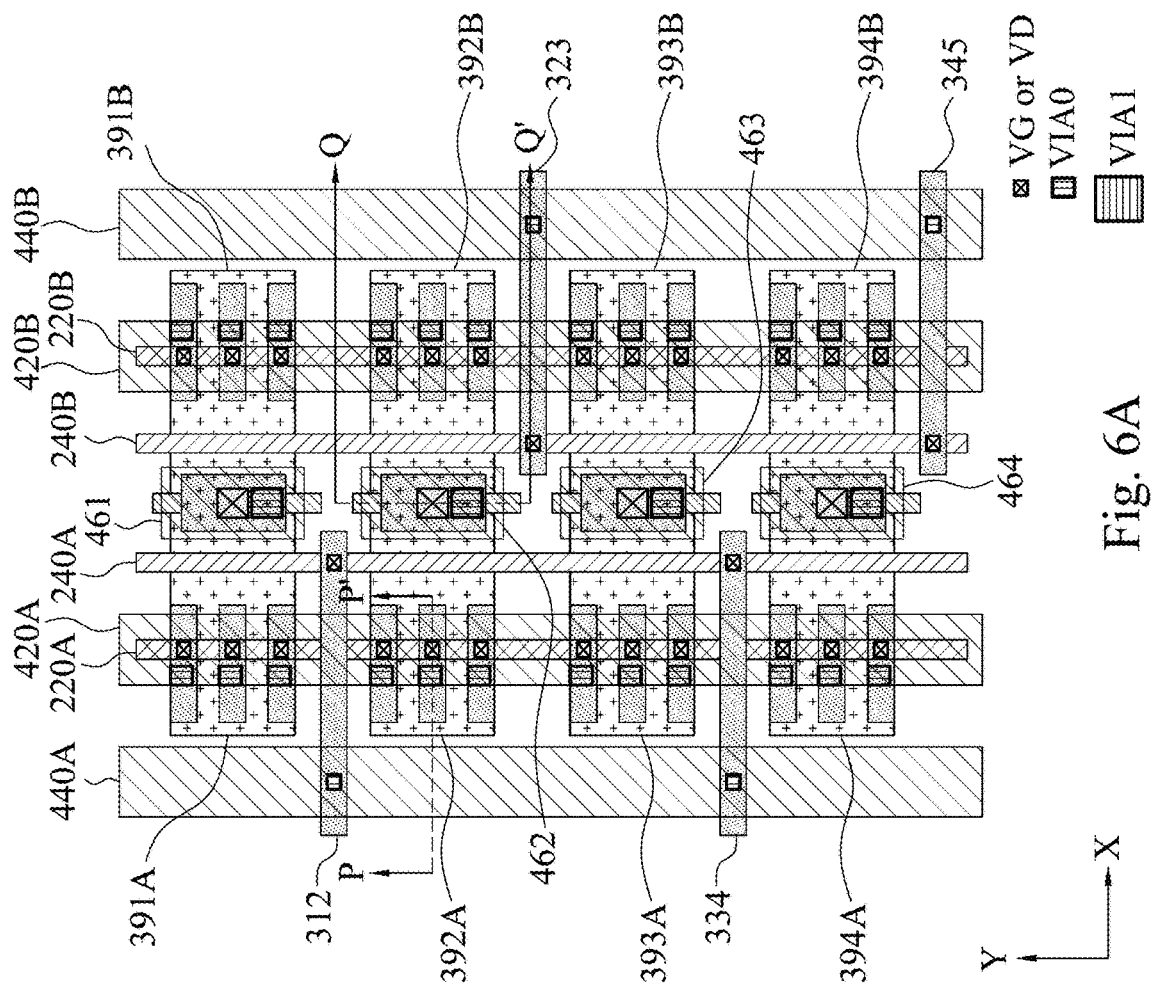

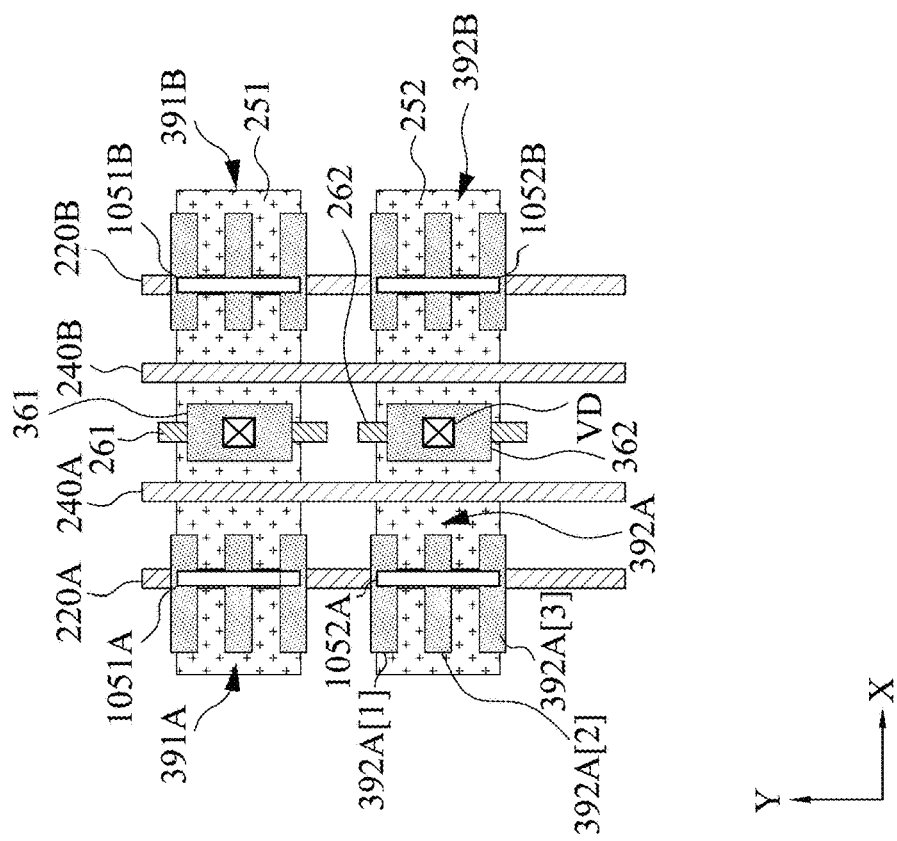
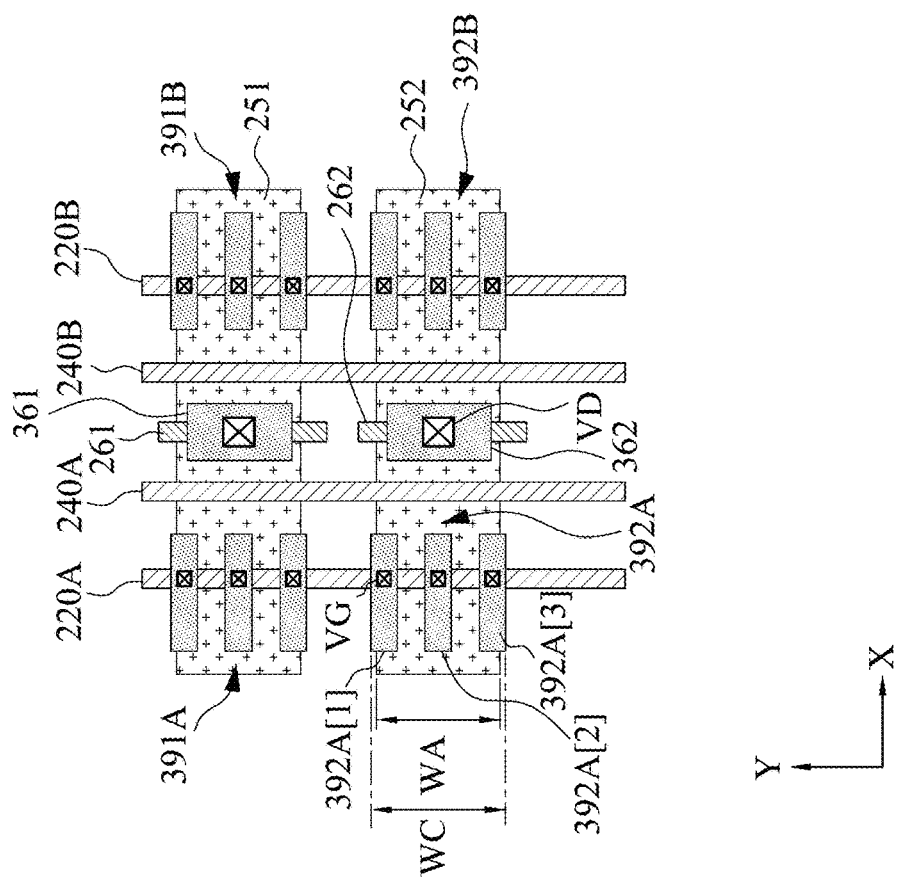
Fig. 10B
Fig. 10A

MEMORY DEVICE WITH IMPROVED ANTI-FUSE READ CURRENT

PRIORITY CLAIM

The present application is a divisional of U.S. application Ser. No. 17/103,073, filed Nov. 24, 2020, which claims the priority of U.S. Provisional Application No. 63/034,657, filed Jun. 4, 2020, each of which is incorporated herein by reference in its entirety.

BACKGROUND

Integrated circuits (ICs) sometimes include one-time-programmable (OTP) memory elements to provide non-volatile memory (NVM) in which data are not lost when the IC is powered off. One type of NVM includes an anti-fuse bit integrated into an IC by using a layer of dielectric material (oxide or the like) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a partial layout diagram of a memory device, based upon the layout diagrams of FIGS. 2-3, in accordance with some embodiments.

FIG. 4B is a cross-sectional view of the memory device in a cutting plane as specified by the line P-P' in FIG. 4A, in accordance with some embodiments.

FIG. 4C is a cross-sectional view of the memory device in a cutting plane as specified by the line Q-Q' in FIG. 4A, in accordance with some embodiments.

FIG. 5A is a partial layout diagram of a memory device, based upon the layout diagrams of FIGS. 2-3, in accordance with some embodiments.

FIG. 5B is a cross-sectional view of the memory device in a cutting plane as specified by the line P-P' in FIG. 5A, in accordance with some embodiments.

FIG. 5C is a cross-sectional view of the memory device in a cutting plane as specified by the line Q-Q' in FIG. 5A, in accordance with some embodiments.

FIG. 6A is a partial layout diagram of a memory device, based upon the layout diagrams of FIGS. 2-3, in accordance with some embodiments.

FIG. 6B is a cross-sectional view of the memory device in a cutting plane as specified by the line P-P' in FIG. 6A, in accordance with some embodiments.

FIG. 6C is a cross-sectional view of the memory device in a cutting plane as specified by the line Q-Q' in FIG. 6A, in accordance with some embodiments.

FIG. 10A is a partial layout diagram of a part of a memory circuit, in accordance with some embodiments.

FIG. 10B is a partial layout diagram of a part of a memory circuit having extended via-connectors, based on a modification of FIG. 10A, in accordance with some embodiments.

DETAILED DESCRIPTION

Figure 1:
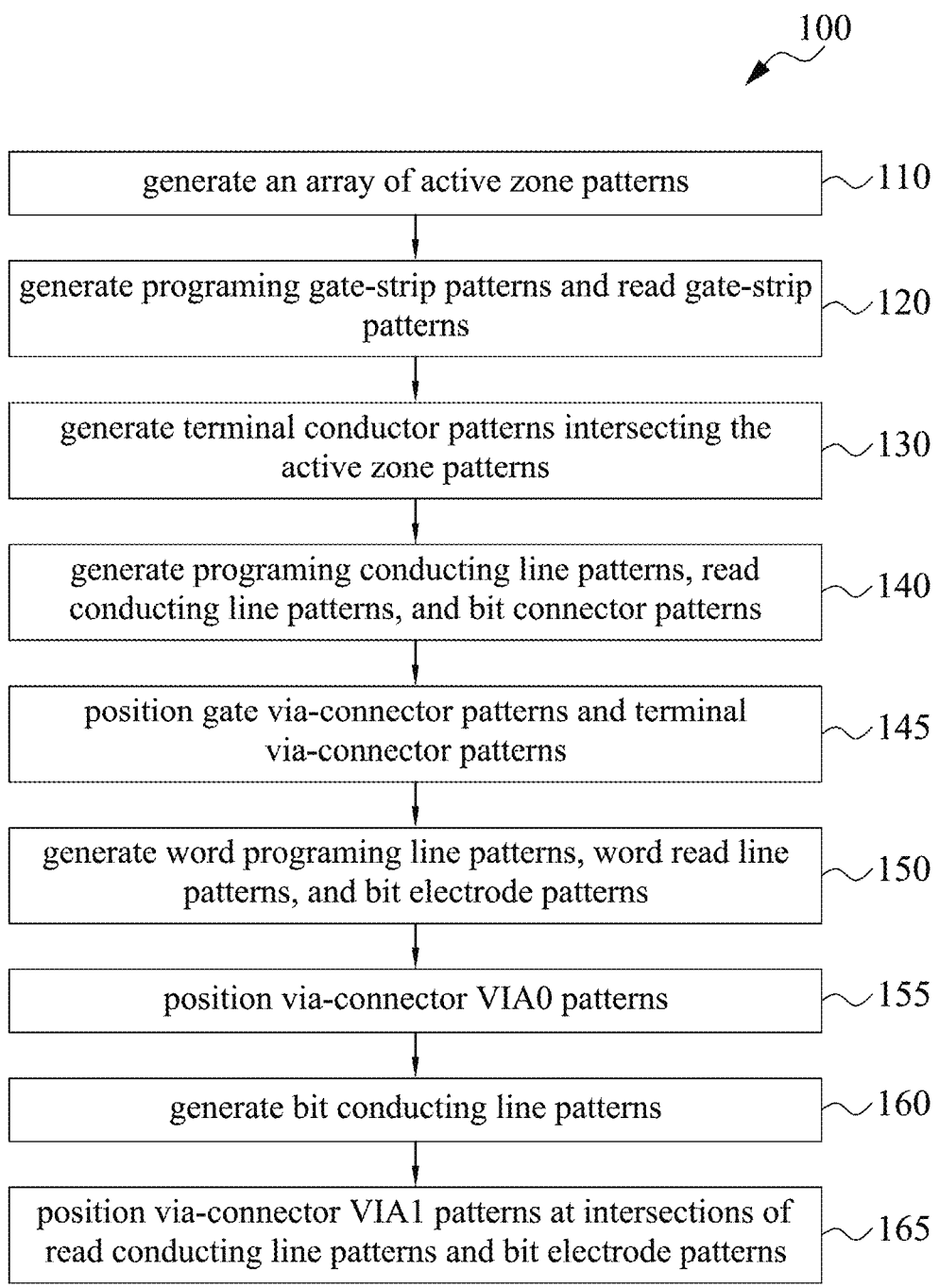
FIG. 1 is a flowchart of a method of generating a layout design of a memory device in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device generally includes an array of memory cells. In some embodiments, a one-bit memory cell includes an anti-fuse structure and a read transistor. The anti-fuse structure has a dielectric layer overlying a semiconductor region that is conductively connected to a first semiconductor terminal of the read transistor, while a second semiconductor terminal of the read transistor is conductively connected to a bit conducting line. The gate of the anti-fuse structure is conductively connected to a word programming line, and the gate terminal of the read transistor is conductively connected to a word read line. After the memory device is programmed, the resistive value of the dielectric layer between the semiconductor region and the gate of the anti-fuse structure corresponds to the stored logic value in the one-bit memory cell.

During the read operation, when the read transistor is turned on and a reading voltage is applied to the word programming line, a current passing through the dielectric layer of the anti-fuse structure is induced. The induced current, after passing through the semiconductor channel of the read transistor and through the bit conducting line, is detected by a sense amplifier. The induced current detected by the sense amplifier is used to determine the stored logic value in the one-bit memory cell. In some embodiments, improving the conductive connection between the word programming line and the gate of the anti-fuse structure improves the sensitivity and the reliability for the sense amplifier to detect the current passing through the dielectric layer of the anti-fuse structure. In some embodiments, improving the conductive connection between the second semiconductor terminal of the read transistor and the bit conducting line also improves the sensitivity and the reliability for the sense amplifier to detect the current passing through the dielectric layer of the anti-fuse structure.

FIG. 1 is a flowchart of a method 100 of generating a layout design of a memory device in accordance with some embodiments. FIGS. 2-3, FIG. 4A and FIG. 5A are partial layout diagrams of memory devices at various stages of layout design processes, in accordance with some embodiments.

In operation 110 of the method 100 in FIG. 1, an array of active zone patterns is generated. Each active zone pattern specifies a corresponding active zone in the memory device. In operation 120, programming gate-strip patterns and read gate-strip patterns are generated intersecting the active zone patterns. Each programming gate-strip pattern specifies a corresponding programming gate-strip in the memory device. Each read gate-strip pattern specifies a corresponding read gate-strip in the memory device. In operation 130, terminal conductor patterns intersecting the active zone patterns are generated. Each terminal conductor pattern specifies a corresponding terminal conductor in the memory device. In some embodiments, the partial layout diagram of the memory device generated after operation 130 is show in FIG. 2.

Figure 2:
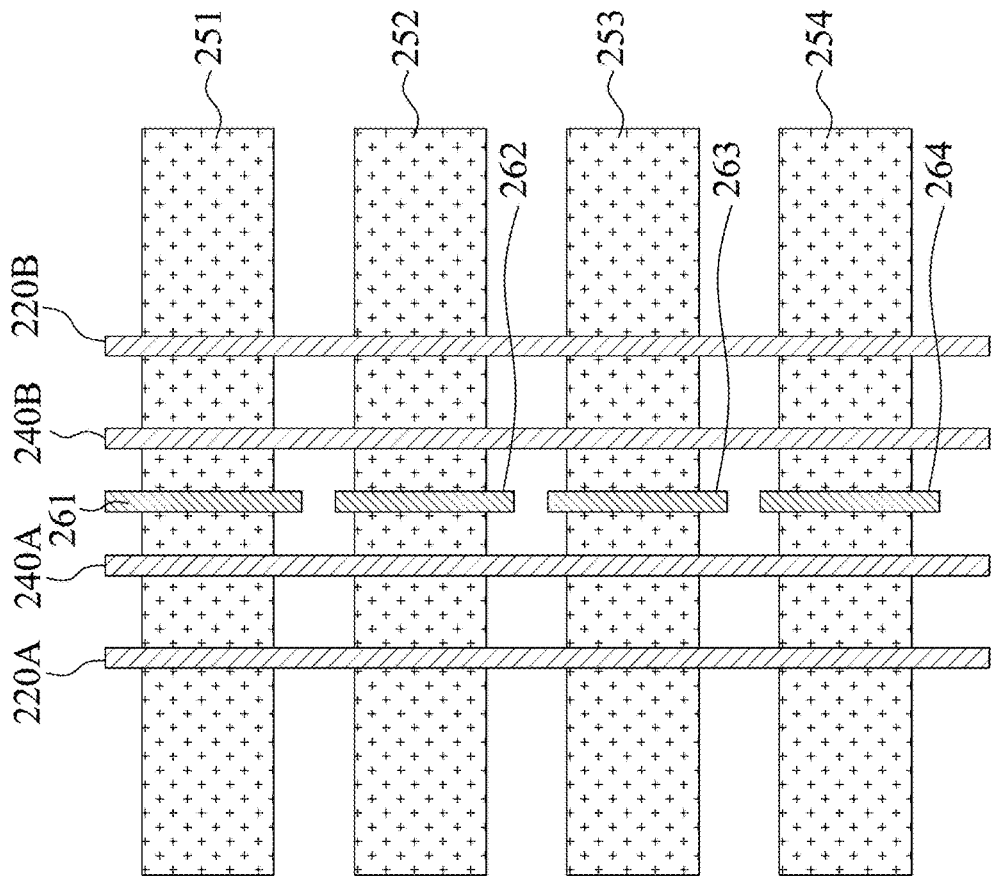
FIG. 2-3 are partial layout diagrams of a memory device at various stages of layout design processes, in accordance with some embodiments.

As specified by the partial layout diagram of FIG. 2, the memory device includes an array of active zones 251-254 extending in the X-direction, programming gate-strips 220A and 220B extending in the Y-direction, and read gate-strips 240A and 240B extending in the Y-direction. The Y-direction is perpendicular to the X-direction. The memory device also includes terminal conductors 261, 262, 263, and 264 extending in the Y-direction. The terminal conductors 261, 262, 263, and 264 provides the source terminals or drain terminals of the transistors in the active zone.

The programming gate-strips 220A and 220B are configured to program anti-fuse structures. The programming gate-strip 220A intersects each of the active zones 251-254 over a semiconductor region of an anti-fuse structure programmable by the programming gate-strips 220A, while the conductive coupling between the programming gate-strips 220A and the semiconductor region depends upon the isolation properties of a dielectric layer overlying the semiconductor region. The programming gate-strip 220B intersects each of the active zones 251-254 over a semiconductor region of an anti-fuse structure programmable by the programming gate-strips 220B, while the conductive coupling between the programming gate-strips 220B and the semiconductor region depends upon the isolation properties of a dielectric layer overlying the semiconductor region. The read gate-strips 240A and 240B are configured to control channel conductivities of read transistors. The read gate-strip 240A intersects each of the active zones 251-254 over a channel region of a read transistor having the gate electrode connected to the read gate-strip 240A. The read gate-strip 240B intersects each of the active zones 251-254 over a channel region of a read transistor having the gate electrode connected to the read gate-strip 240B. Each of the terminal conductors 261, 262, 263, and 264 intersects correspondingly the active zones 251, 252, 253, or 254 over a terminal region of a first read transistor and a second read transistor, while the gate electrodes of the first read transistor and the second read transistor are correspondingly connected to the read gate-strip 240A and the read gate-strip 240B. A terminal region of a transistor is either a source region of the transistor or a drain region of the transistor.

In FIG. 1, after operation 130, more layout patterns are generated. In operation 140, programming conducting line patterns, read conducting line patterns, and bit connector patterns are generated. Each programming conducting line pattern specifies a corresponding programming conducting line in the memory device, each read conducting line pattern specifies a corresponding read conducting line in the memory device, and each bit connector pattern specifies a corresponding bit connector in the memory device. In operation 145, gate via-connector patterns and terminal via-connector patterns are positioned at various locations. Each gate via-connector pattern specifies a corresponding gate via-connector in the memory device, and each terminal via-connector pattern specifies a corresponding terminal via-connector in the memory device. The gate via-connector patterns are positioned at intersections between the programming gate-strip patterns and the programming conducting line patterns and at intersections between the programming gate-strip patterns and the read conducting line patterns. The terminal via-connector patterns are positioned at the overlapped areas formed by the bit connector patterns and the terminal conductor patterns. In some embodiments, the partial layout diagram of the memory device generated after operation 145 is show in FIG. 3.

Figure 3:
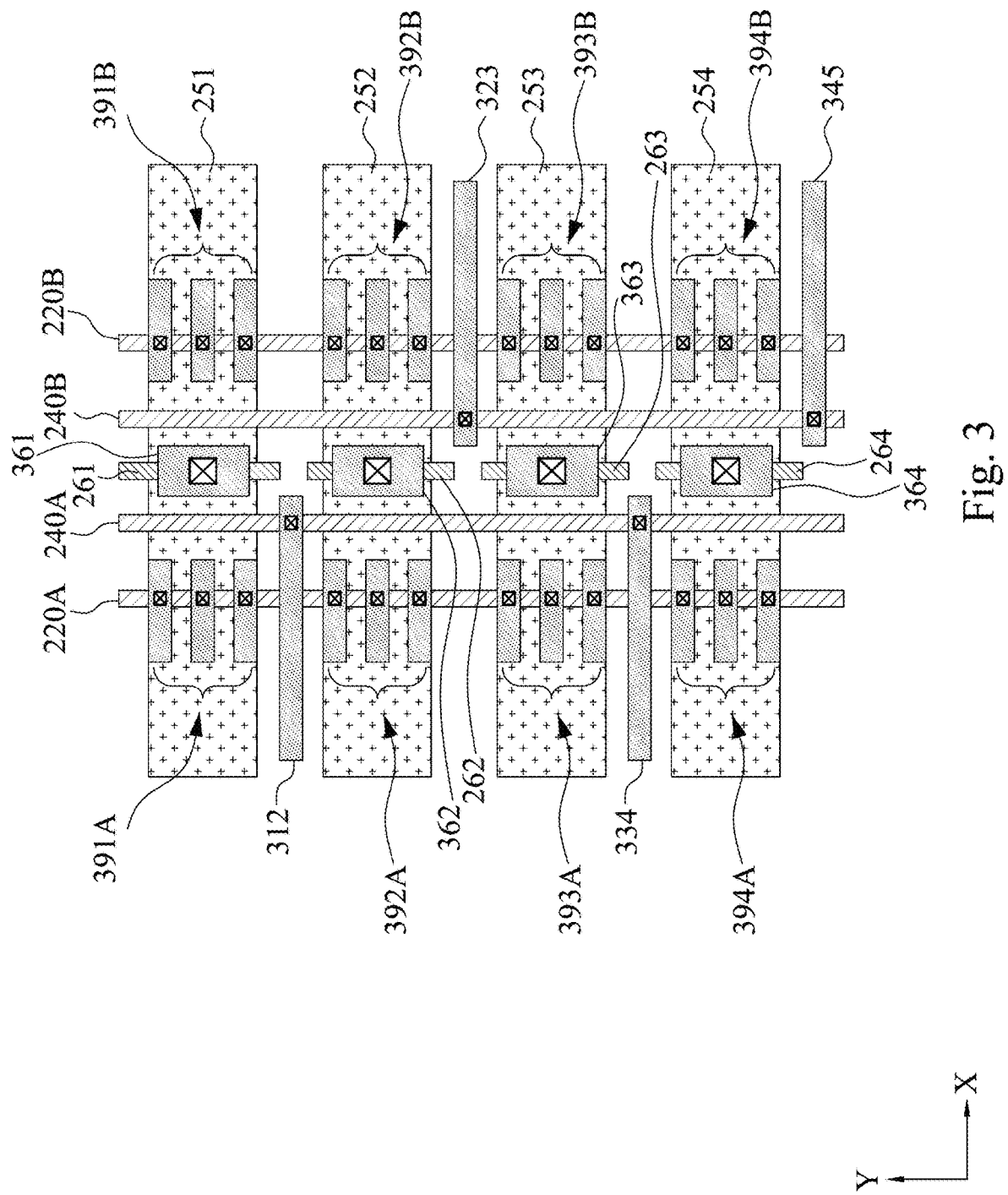

The partial layout diagram of FIG. 3 includes additional drawing patterns superimposed on the partial layout diagram of FIG. 2. As specified by the partial layout diagram of FIG. 3, the memory device also includes programming conducting lines arranged in groups (391A, 392A, 393A, 394A) for the programming gate-strip 220A and programming conducting lines arranged in groups (391B, 392B, 393B, 394B) for the programming gate-strip 220B. Each programming conducting line extends in the X-direction. The programming conducting lines in the group 391A and in the group 391B are associated with the active zone 251. The programming conducting lines in the group 392A and in the group 392B are associated with the active zone 252. The programming conducting lines in the group 393A and in the group 393B are associated with the active zone 253. The programming conducting lines in the group 394A and in the group 394B are associated with the active zone 254. Each of the programming conducting lines in the groups 391A, 392A, 393A, and 394A is conductively connected to the programming gate-strip 220A through the gate via-connector VG. Each of the programming conducting lines in the groups 391B, 392B, 393B, and 394B is conductively connected to the programming gate-strip 220B through the gate via-connector VG.

As specified by the partial layout diagram of FIG. 3, the memory device further includes bit connectors 361, 362, 363, and 364. Each of the bit connectors 361, 362, 363, and 364 is conductively connected to one of the corresponding terminal conductors 261, 262, 263, and 264 through a terminal via-connector VD.

As specified by the partial layout diagram of FIG. 3, the memory device also includes read conducting lines 312 and 334 for the read gate-strip 240A and read conducting lines 323 and 345 for the read gate-strip 240B. The read conducting lines 312 extending in the X-direction is parallelly positioned between the active zones 251 and the active zones 252. The read conducting lines 334 extending in the X-direction is parallelly positioned between the active zones 253 and the active zones 254. The read conducting lines 323 extending in the X-direction is parallelly positioned between the active zones 252 and the active zones 253. The read conducting lines 345 extending in the X-direction is parallelly positioned between the active zones 254 and another adjacent active zone (not shown in the figure). Each of the read conducting lines 312 and 334 is conductively connected to the read gate-strip 240A through the gate via-connector VG. Each of the read conducting lines 323 and 345 is conductively connected to the read gate-strip 240B through the gate via-connector VG.

In FIG. 1, after operation 145, more layout patterns are generated. In operation 150, word programming line patterns, word read line patterns, and bit electrode patterns are generated. Each word programming line pattern specifies a corresponding word programming line in the memory device. Each word read line pattern specifies a corresponding word read line in the memory device. Each bit electrode pattern specifies a corresponding bit electrode in the memory device. In operation 155, via-connector VIA0 patterns are positioned at various locations. Each via-connector VIA0 pattern specifies a corresponding via-connector VIA0 in the memory device. Some of the via-connector VIA0 patterns are positioned at intersections between the programming conducting line patterns and the word programming line patterns. Some of the via-connector VIA0 patterns are positioned at intersections between the read conducting line patterns and the word read line patterns. Some of the via-connector VIA0 patterns are positioned at the overlapped areas formed by the bit electrode patterns and the bit connector patterns. In some embodiments, the partial layout diagram of the memory device generated after operation 155 is show in FIG. 4A.

The partial layout diagram of FIG. 4A includes additional drawing patterns superimposed on the partial layout diagram of FIG. 3. As specified by the partial layout diagram of FIG. 4A, the memory device further includes bit electrodes 461, 462, 463, and 464. Each of the bit electrodes 461, 462, 463, and 464 is conductively connected to one of the corresponding bit connectors 361, 362, 363, and 364 through a via-connector VIA0. As specified by the partial layout diagram of FIG. 4A, the memory device also includes word programming lines 420A and 420B extending in the Y-direction and word read lines 440A and 440B extending in the Y-direction. The word programming line 420A is conductively connected to the programming conducting lines in the groups 391A, 392A, 393A, and 394A through the via-connectors VIA0 at the intersections between the word programming lines 420A and the programming conducting lines. The word programming line 420B is conductively connected to the programming conducting lines in the groups 391B, 392B, 393B, and 394B through the via-connectors VIA0 at the intersections between the word programming lines 420B and the programming conducting lines. The word read line 440A is conductively connected to the read conducting lines 312 and 334 through the via-connectors VIA0 at the intersections between the word read lines 440A and the read conducting lines. The word read line 440B is conductively connected to the read conducting lines 323 and 345 through the via-connectors VIA0 at the intersections between the word read lines 440B and the read conducting lines.

FIG. 4B is a cross-sectional view of the memory device in a cutting plane as specified by the line P-P' in FIG. 4A, in accordance with some embodiments. In FIG. 4B, the word programming line 420A is conductively connected to the programming gate-strip 220A through the programming conducting lines in the group 392A. The programming conducting lines in the group 392A overlie an insulation layer ILD1 of inter-layer-dielectric materials. The insulation layer ILD1 covers the programming gate-strip 220A and the semiconductor materials in the active zone 252. In some embodiments, the semiconductor materials in the active zone 252 as shown in FIG. 4B is a cross-section of a fin structure. The programming gate-strip 220A forms a gate electrode of an anti-fuse structure. The anti-fuse structure has a dielectric layer 456 between the programming gate-strip 220A and a semiconductor region 458 in the active zone 252. The gate via-connector VG, which passes though the insulation layer ILD1, conductively connects the programming conducting line in the group 392A to the programming gate-strip 220A. In FIG. 4B, the word programming line 420A and the word read line 440A overlie an insulation layer ILD2 of inter-layer-dielectric materials. The insulation layer ILD2 covers the programming conducting lines in the group 392A and the insulation layer ILD1. The via-connector VIA0, which passes though the insulation layer ILD2, conductively connects the word programming line 420A to the programming conducting line in the group 392A.

FIG. 4C is a cross-sectional view of the memory device in a cutting plane as specified by the line Q-Q' in FIG. 4A, in accordance with some embodiments. In FIG. 4C, the bit electrode 462 is conductively connected to the terminal conductor 262 through the bit connector 362. The bit electrode 462 overlies the insulation layer ILD2 which covers the bit connector 362 and the insulation layer ILD1. The bit connector 362 overlies the insulation layer ILD1 which covers the terminal conductor 262. The terminal conductor 262 overlaps the source/drain regions of two read transistors in the active zone 252. One of the two read transistors (as specified in FIG. 4A) has the channel region at the intersection (in FIG. 4A) between the read gate-strips 240A and the active zone 252. Another one of the two read transistors (as specified in FIG. 4A) has the channel region at the intersection (in FIG. 4A) between the read gate-strips 240B and the active zone 252. In some embodiments, the read transistors are formed with fin structures. In the non-limiting example of FIG. 4C, the read transistors are formed with three fin structures within the active zone 252, and the terminal conductor 262 forms conductive contact with the source/drain regions in the three fin structures. In alternative embodiments, the read transistors are formed as planar transistors, and the terminal conductor 262 forms conductive contact with the source/drain regions in the heavily doped diffusion regions of the active zone 252. In still alternative embodiments, the read transistors are formed as nano transistors, and the terminal conductor 262 forms conductive contact with the source/drain regions in the nano-wires or the nano-sheets of the nano transistors. In FIG. 4C, the via-connector VIA0, which passes though the insulation layer ILD2, conductively connects the bit electrode 462 with the bit connector 362. The terminal via-connector VD, which passes though the insulation layer ILD1, conductively connects the bit connector 362 with the terminal conductor 262.

In FIG. 1, after operation 155, more layout patterns are generated. In operation 160, bit conducting line patterns are generated. Each bit conducting line pattern specifies a corresponding bit conducting line in the memory device. In operation 165, via-connector VIA1 patterns are positioned at various locations. Each via-connector VIA1 pattern specifies a corresponding via-connector VIA1 in the memory device. The via-connector VIA1 patterns are positioned at the overlapped areas formed by the bit electrode patterns and the bit conducting line patterns. In some embodiments, the partial layout diagram of the memory device generated after operation 165 is show in FIG. 5A.

The partial layout diagram of FIG. 5A includes additional drawing patterns superimposed on the partial layout diagram of FIG. 4A. As specified by the partial layout diagram of FIG. 5A, the memory device includes bit conducting lines 510, 520, 530, and 540 extending in the X-direction. Each of the bit conducting lines (510, 520, 530, and 540) is conductively connected to a corresponding bit electrode (461, 462, 463, or 464) through a via-connector VIA1.

FIG. 5B is a cross-sectional view of the memory device in a cutting plane as specified by the line P-P' in FIG. 5A, in accordance with some embodiments. FIG. 5C is a cross-sectional view of the memory device in a cutting plane as specified by the line Q-Q' in FIG. 5A, in accordance with some embodiments. In FIG. 5B and FIG. 5C, the bit conducting line 520 overlies the insulation layer ILD3. In FIG. 5B, the insulation layer ILD3 covers the word programming line 420A and the word read line 440A. In FIG. 5C, the insulation layer ILD3 covers the bit electrode 462. The via-connector VIA1, which passes though the insulation layer ILD3, conductively connects the bit conducting line 520 to the bit electrode 462.

In the partial layout diagram of FIG. 4A, the area of a via-connector VIA0 is larger than the area of a gate via-connector VG, and the boundary of a gate via-connector VG is within the boundary of a via-connector VIA0. In alternative embodiments, the area of a via-connector VIA0 is smaller than the area of a gate via-connector VG, the boundary of a via-connector VIA0 is within the boundary of a gate via-connector VG. In some embodiments, the area of a via-connector VIA0 is equal to the area of a gate via-connector VG, and a via-connector VIA0 and a gate via-connector VG occupy the same area in a layout diagram.

In the partial layout diagram of FIG. 5A, the area of a via-connector VIA1 is larger than the area of a via-connector VIA0 and the area of the terminal via-connector VD. In alternative embodiments, the area of a via-connector VIA1 is smaller than the area of a via-connector VIA0 and/or the area of the terminal via-connector VD. In some embodiments, the area of a via-connector VIA1 is equal to the area of a via-connector VIA0 and/or the area of the terminal via-connector VD. In some embodiments, as shown in FIGS. 6A-6C and FIGS. 7A-7C, some of the via-connector VIA1, the via-connector VIA0, the gate via-connector VG, and the terminal via-connector VD do not have overlapped area.

FIG. 6A is a partial layout diagram of a memory device at an intermediate stage of layout design processes, in accordance with some embodiments. FIG. 6B is a cross-sectional view of the memory device in a cutting plane as specified by the line P-P' in FIG. 6A, in accordance with some embodiments. FIG. 6C is a cross-sectional view of the memory device in a cutting plane as specified by the line Q-Q' in FIG. 6A, in accordance with some embodiments. With the exception of the via-connector VIA0 patterns, the layout design in FIG. 6A is identical to the layout design in FIG. 4A. As a comparison, a via-connector VIA0 pattern in FIG. 4A overlaps with a gate via-connector VG pattern or a terminal via-connector VD pattern. In FIG. 6A, however, a via-connector VIA0 pattern does not overlap with a gate via-connector VG or with a terminal via-connector VD. For example, in FIG. 6A and FIG. 6B, the via-connector VIA0 for connecting the word programming line 420A with the programming conducting line (e.g., in the group 392A) is shifted in the X-direction relative to the gate via-connector VG for connecting the programming gate-strip 220A with the programming conducting line (e.g., in the group 392A). In FIG. 6A and FIG. 6C, the via-connector VIA0 for connecting the bit electrode (e.g., 462) with the bit connector (e.g., 362) is shifted in the Y-direction relative to the terminal via-connector VD for connecting the terminal conductor (e.g., 262) with the bit connector (e.g., 362).

Figure 7B:
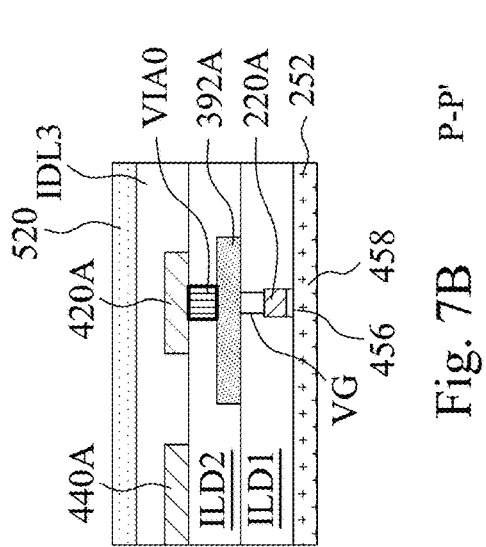
FIG. 7B is a cross-sectional view of the memory device in a cutting plane as specified by the line P-P' in FIG. 7A, in accordance with some embodiments.
Figure 7C:
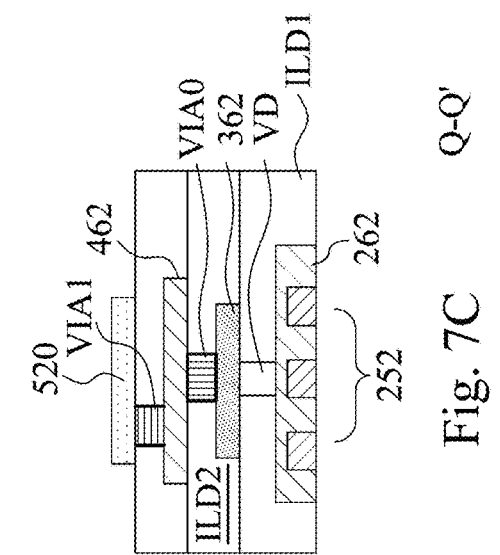
FIG. 7C is a cross-sectional view of the memory device in a cutting plane as specified by the line Q-Q' in FIG. 7A, in accordance with some embodiments.
Figure 7A:
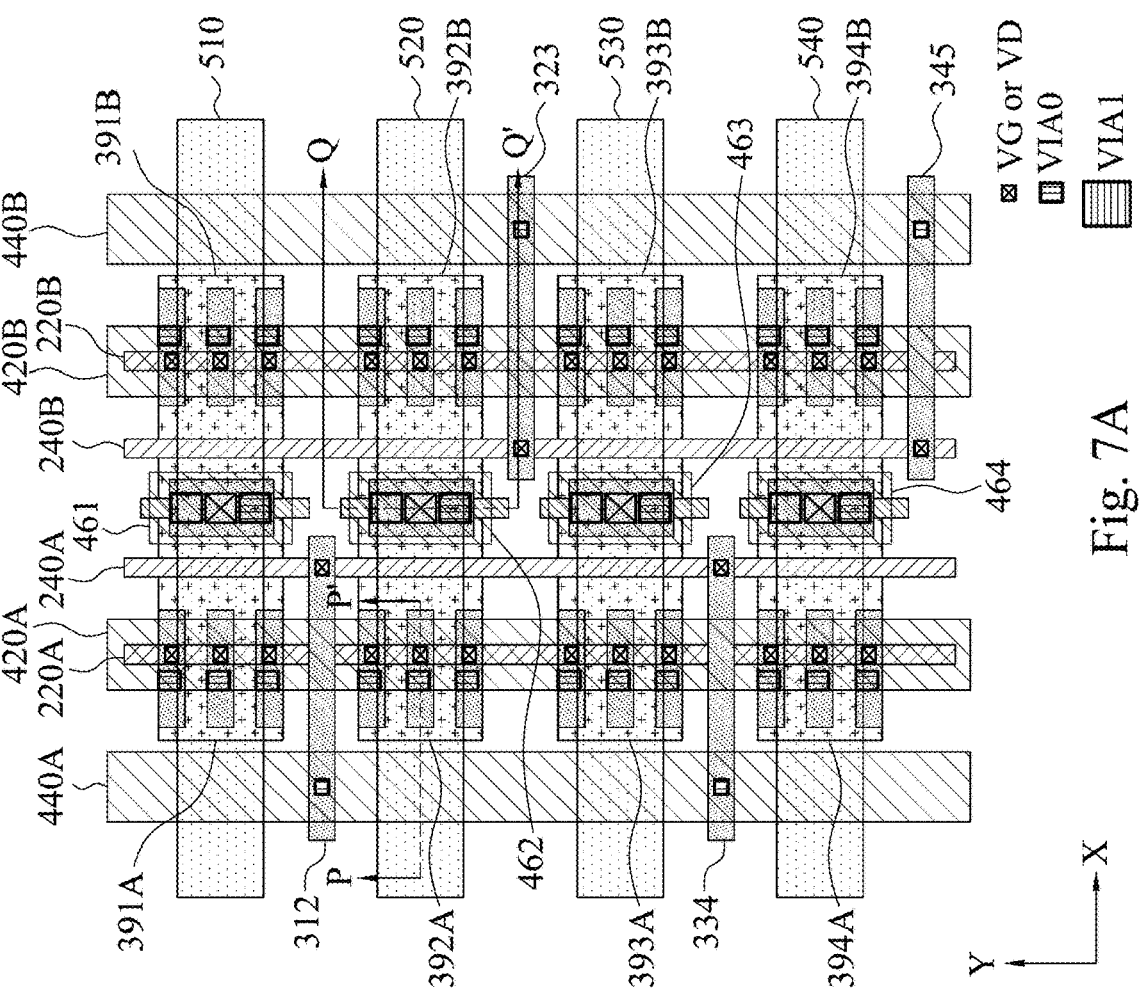
FIG. 7A is a partial layout diagram of a memory device, based upon the layout diagrams of FIGS. 2-3, in accordance with some embodiments.

FIG. 7A is partial layout diagram of a memory device at an intermediate stage of layout design processes, in accordance with some embodiments. FIG. 7B is a cross-sectional view of the memory device in a cutting plane as specified by the line P-P' in FIG. 7A, in accordance with some embodiments. FIG. 7C is a cross-sectional view of the memory device in a cutting plane as specified by the line Q-Q' in FIG. 7A, in accordance with some embodiments. With the exception of the via-connector VIAL patterns and the via-connector VIA0 patterns, the layout design in FIG. 7A is identical to the layout design in FIG. 5A. As a comparison, a via-connector VIAL in FIG. 5A overlaps with a via-connector VIA0 and a terminal via-connector VD. In FIG. 7A, however, a via-connector VIAL does not overlap with a via-connector VIA0 or a terminal via-connector VD. For example, in FIG. 7A and FIG. 7C, the via-connector VIAL for connecting the bit conducting line 520 with the bit electrode 462 is shifted in the Y-direction relative to the via-connector VIA0 for connecting the bit electrode 462 with the bit connector 362. In FIG. 7A and FIG. 7C, the via-connector VIAL for connecting the bit conducting line 520 with the bit electrode 462 is also shifted in the Y-direction relative to the terminal via-connector VD for connecting the terminal conductor 262 with the bit connector 362.

Figure 8A:
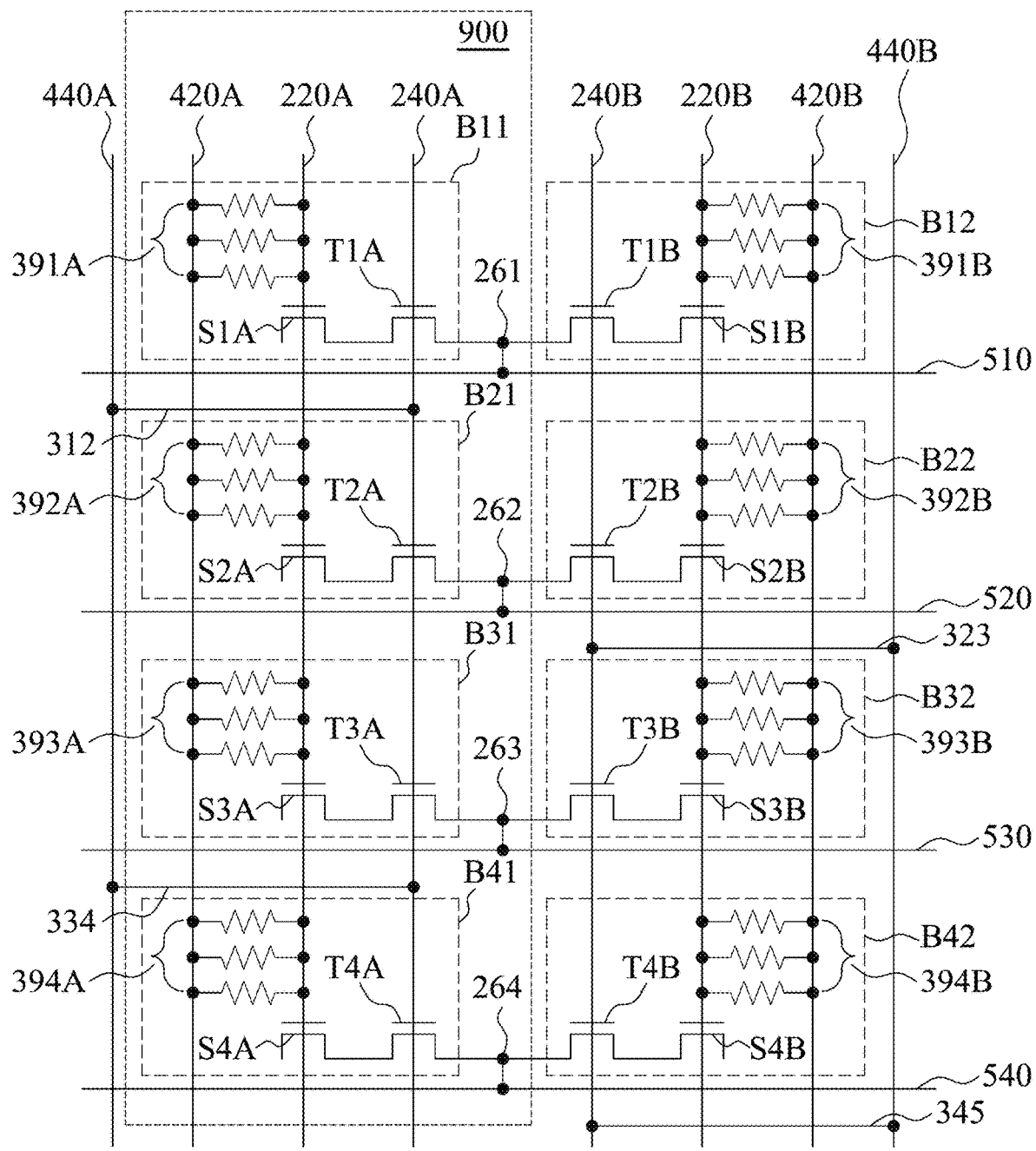
FIG. 8A is an equivalent circuit of the memory device as specified by one of the partial layout diagrams in FIG. 5A and in FIG. 7A, in accordance with some embodiments.

FIG. 8A is an equivalent circuit of the memory device as specified by one of the partial layout diagrams in FIG. 5A and in FIG. 7A, in accordance with some embodiments. In FIG. 8A, the gate terminals of the anti-fuse structures S1A, S2A, S3A, and S4A are connected by the programming gate-strip 220A, and the gate terminals of the anti-fuse structures S1B, S2B, S3B, and S4B are connected by the programming gate-strip 220B. Each of the gate terminals of the anti-fuse structures S1A, S2A, S3A, and S4A is connected to the word programming line 420A correspondingly through the programming conducting lines in the groups 391A, 392A, 393A, and 394A. Each of the gate terminals of the anti-fuse structures S1B, S2B, S3B, and S4B is connected to the word programming line 420B correspondingly through the programming conducting lines in the groups 391B, 392B, 393B, and 394B. In FIG. 8A, each group of the programming conducting lines (e.g., each of the groups 391A-394A and 391B-394B) has three programming conducting lines. In other embodiments, each group of the programming conducting lines has more three programming conducting lines. The number of the programming conducting lines matches the number of connections from the gate terminal of an anti-fuse structure to a corresponding word programming line. Each connection from the gate terminal of an anti-fuse structure to a corresponding word programming line is equivalent to a resistive element in FIG. 8A. The number of the programming conducting lines is selected to minimize the electric resistance of the parallel connections from the gate terminal of an anti-fuse structure to a corresponding word programming line while the areas of the programming conducting lines are maintained within the upper limit of the allocated area for the parallel connections.

In FIG. 8A, the gate terminals of the read transistors T1A, T2A, T3A, and T4A are connected by the read gate-strip 240A, and the gate terminals of the read transistors T1B, T2B, T3B, and T4B are connected by the read gate-strip 240B. The semiconductor terminals of the read transistors T1A and T1B at the terminal conductor 261 are jointly connected to the bit conducting lines 510. The semiconductor terminals of the read transistors T2A and T2B at the terminal conductor 262 are jointly connected to the bit conducting lines 520. The semiconductor terminals of the read transistors T3A and T3B at the terminal conductor 263 are jointly connected to the bit conducting lines 530. The semiconductor terminals of the read transistors T4A and T4B at the terminal conductor 264 are jointly connected to the bit conducting lines 540. The read gate-strip 240A is conductively connected to the word read line 440A through read conducting lines 312 and 334. The read gate-strip 240B is conductively connected to the word read line 440B through read conducting lines 323 and 345.

In FIG. 8A, the memory device includes two one-bit memory cells B11 and B12 in a first row, two one-bit memory cells B21 and B22 in a second row, two one-bit memory cells B31 and B32 in a third row, and two one-bit memory cells B41 and B42 in a fourth row. In each row of the memory device, the two anti-fuse structures, the two read transistors, and the two groups of programming conducting lines are connected as a two-bit memory cell. The two-bit memory cell in each row includes a first one-bit memory cell and a second one-bit memory cell. The first one-bit memory cell includes a first anti-fuse structure controlled by the word programming line 420A, and a first read transistor controlled by the word read line 440A. The first one-bit memory cell also includes the group of the programming conducting lines directly connected to the gate of the first anti-fuse structure. The second one-bit memory cell includes a second anti-fuse structure controlled by the word programming line 420B, and a second read transistor controlled by the word read line 440B. The second one-bit memory cell also includes the group of the programming conducting lines directly connected to the gate of the second anti-fuse structure. As an example, in the second row of the memory device, a two-bit memory cell includes two anti-fuse structures S2A and S2B, two read transistors T2A and T2B, and two groups (392A and 392B) of programming conducting lines. The first one-bit memory cell B21 in the second row includes the anti-fuse structures S2A, the read transistors T2A, and the group 392A of programming conducting lines. The second one-bit memory cell B22 in the second row includes the anti-fuse structures S2B, the read transistors T2B, and the group 392B of programming conducting lines.

In FIG. 8A, a column of one-bit memory cells B11, B21, B31, and B41 forms an array of first one-bit memory cells, and a column of one-bit memory cells B12, B22, B32, and B42 forms an array of second one-bit memory cells. The array of the first one-bit memory cells is controlled by the word programming line 420A and the word read line 440A. The array of the second one-bit memory cells is controlled by the word programming line 420B and the word read line 440B. Each one-bit memory cell in the memory device is configured to store a logic "1" or a logic "0" based on the resistance of the anti-fuse structure in the one-bit memory cell. In general, the anti-fuse structure and the read transistor in a one-bit memory cell can be based on either NMOS devices or PMOS devices.

During the programming operation, in some embodiments, one column of the one-bit memory cells is selected for programming during each allocated time period by setting the one-bit memory cells in the selected column to the programming mode, while the one-bit memory cells in other column are set to the non-programming mode. For example, the first column of one-bit memory cells B11, B21, B31, and B41 is selected for programming during a first allocated time period, and the second column of one-bit memory cells B12, B22, B32, and B44 is selected for programming during a second allocated time period after the first allocated time period.

During the first allocated time period, to set each of the one-bit memory cells B11, B21, B31, and B41 in the first column to the programming mode, the read transistor in each of the one-bit memory cells in the first column is tuned on by a voltage applied to the word read line 440A, and the gate terminal of the anti-fuse structure in each of the one-bit memory cells in the first column is maintained at a programming voltage supplied by the word programming line 420A. When the one-bit memory cells in the first column are in the programming mode, the voltage level on each of the bit conducting lines 510, 520, 530, and 540 correspondingly determines whether each of the one-bit memory cells B11, B21, B31, and B41 is stored with a logic "1" or with a logic "0".

When a one-bit memory cell is in the programming mode, the residual resistivity of the dielectric layer in the anti-fuse structure after the programming is determined by the voltage difference between the programming voltage applied to the gate of the anti-fuse structure and the voltage applied to the semiconductor region of the one-bit memory cell. The stored logic state (either logic "1" or a logic "0") of the one-bit memory cell is determined by the residual resistivity of the dielectric layer in the anti-fuse structure of the one-bit memory cell after the one-bit memory cell is programed.

For example, after a programming voltage $V_P$ is applied to the word programming line 420A to select the one-bit memory cells B11, B21, B31, and B41 for programming, the residual resistivity of the dielectric layer in the anti-fuse structure of the one-bit memory cell B21 depends upon a bit voltage v[2,1] applied to the bit conducting line 520. The voltage difference $V_P$–V[2,1] determines the residual resistivity of the dielectric layer (e.g., 456, in FIG. 5B or FIG. 7B) in the anti-fuse structure S2A of the one-bit memory cell B21. In some embodiments, when the anti-fuse structure S2A and the read transistor T2A are based on NMOS devices, if the voltage difference $V_P$–V[2,1] is larger than a threshold voltage, the dielectric layer 456 in the anti-fuse structure S2A breaks down. As a consequence, the resistance between the gate of the anti-fuse structure S2A and the semiconductor terminal n2A of the anti-fuse structure S2A changes from a HIGH resistive value to a LOW resistive value. On the other hand, if the voltage difference $V_P$–V[2,1] is smaller than the threshold voltage, the resistance between the gate of the anti-fuse structure S2A and the semiconductor terminal n2A of the anti-fuse structure S2A maintains at a HIGH resistive value. The range of the HIGH resistive value and the range of the LOW resistive value depend upon the thickness, the area, and the material type of the dielectric layer in the anti-fuse structure. The range of the HIGH resistive value and the range of the LOW resistive value also depend upon other design factors in the anti-fuse structure.

Figure 8B:
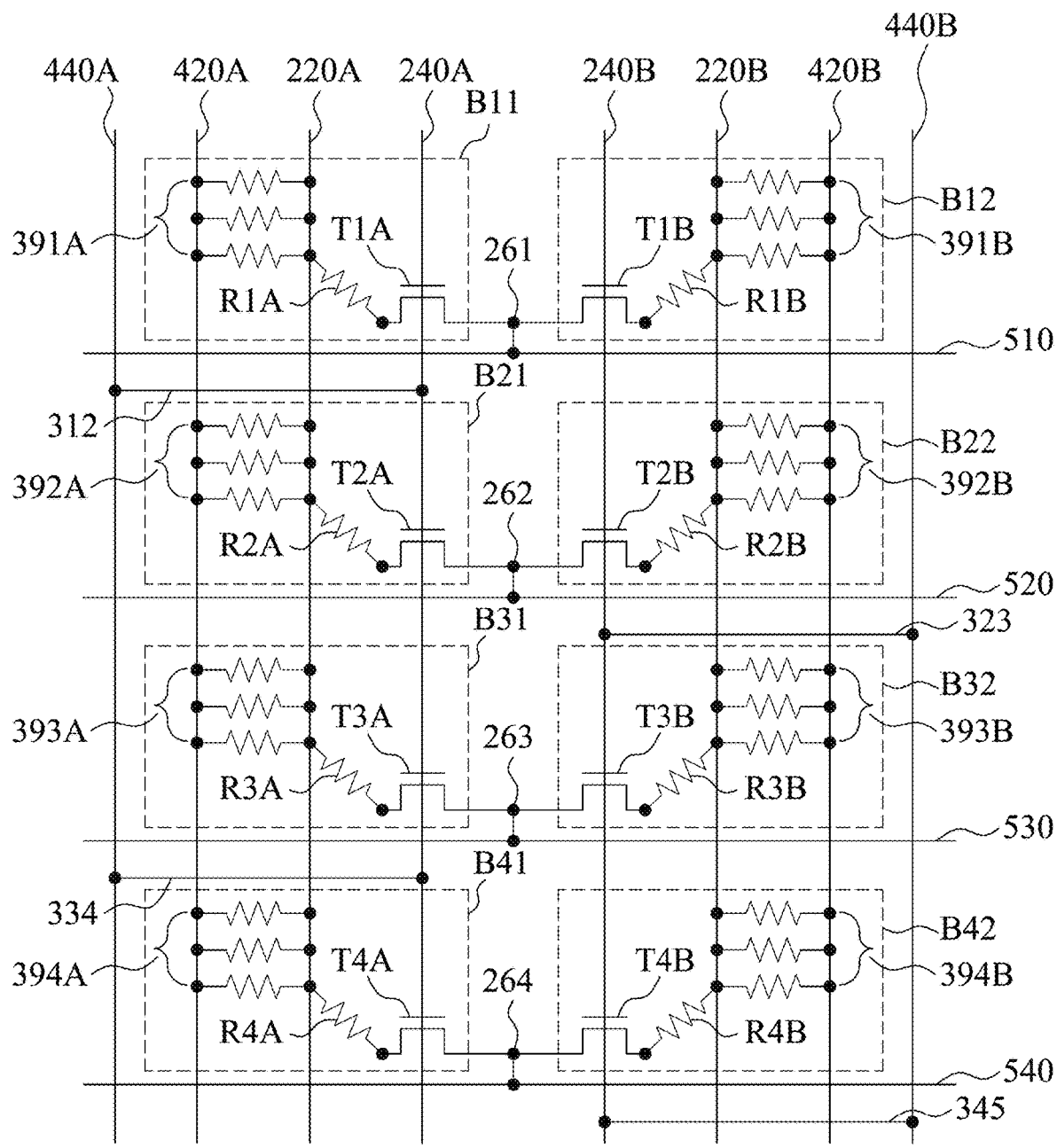
FIG. 8B is an equivalent circuit of the memory device after the memory circuit is programed with the programming operation, in accordance with some embodiments.

During the programming operation, the one-bit memory cells in the memory device are programed column by column. After the programming operation, logic values are stored in the memory device as resistive values in a matrix of residual resistors each depending upon the condition of the dielectric layer in the anti-fuse structure of a corresponding one-bit memory cell. FIG. 8B is an equivalent circuit of the memory device after the memory circuit is programed with the programming operation, in accordance with some embodiments. Each anti-fuse structure is equivalent to a residual resistor which is set to either the HIGH resistive value or the LOW resistive value during the programming operation. The resistive values of the residual resistors are read out during the read operation. In FIG. 8B, each of the residual resistors R11, R21, R31, and R41 is serially connected to a corresponding read transistor (T11, T21, T31, or T41) in one of the one-bit memory cells (B11, B21, B31, and B41) in the first column. Each of the residual resistors R12, R22, R32, and R42 is serially connected to a corresponding read transistor (T12, T22, T32, or T42) in one of the one-bit memory cells (B12, B22, B32, and B42) in the second column.

During the read operation, in some embodiments, one column of the one-bit memory cells is selected for reading during each allocated time period by setting the one-bit memory cells in the selected column to the reading mode, while the one-bit memory cells in other column are set to the non-reading mode. For example, the first column of one-bit memory cells B11, B21, B31, and B41 is selected for reading during a first reading time period, and the second column of one-bit memory cells B12, B22, B32, and B44 is selected for reading during a second reading time period after the first reading time period.

In some embodiments, during the first reading time period, to set each of the one-bit memory cells B11, B21, B31, and B41 in the first column to the reading mode, a selection voltage is applied to the word read line 440A and a reading voltage $V_R$ is applied to the word programming line 420A. The read transistor in each of the one-bit memory cells in the first column is tuned on by the applied selection voltage. When the one-bit memory cells B11, B21, B31, and B41 in the first column are set to the reading mode, the induced current in each of the bit conducting lines 510, 520, 530, or 540 is correspondingly related to the resistive value of the residual resistor (R11, R21, R31, or R41) in one of the one-bit memory cells in the first column. The induced current in each of the bit conducting lines 510, 520, 530, and 540 is detected by a sense amplifier (not shown) and converted into one of the discrete values. The discrete values are related to the HIGH resistive value or the LOW resistive value of a corresponding residual resistor.

Figure 9A:
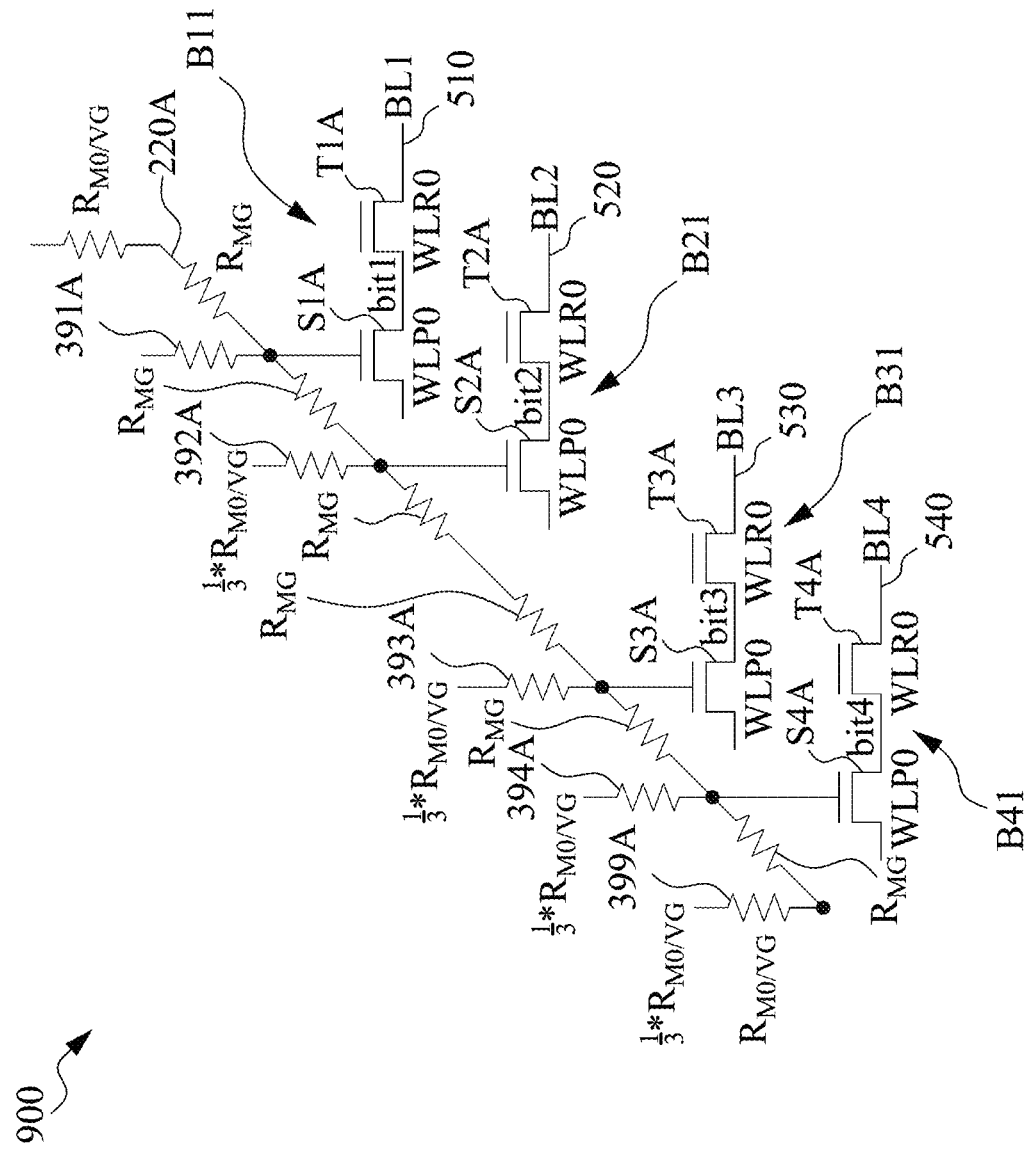
FIG. 9A is an equivalent circuit of the one-bit memory cell in the reading mode, in accordance with some embodiments.

FIG. 9A is a three-dimensional representation of the conductive connections of the column of bit cells 900 in the equivalent circuit of FIG. 8A, in accordance with some embodiments. In FIG. 9A, the resistivity of the programming gate-strip 220A between the gate terminals of two adjacent anti-fuse structures is explicitly represented by a resistor $R_{MG}$. Each connection from the word programming line 420A to a gate terminal of an anti-fuse structure (e.g., S1A, S2A, S3A, or S4A) through a corresponding group of programming conducting lines (e.g., 391A, 392A, 393A, and 394A) is represented by an equivalent resistor $R_{M0/VG}$. The connections from the word programming line 420A to a gate terminal of the anti-fuse structures (not shown in FIG. 8A) in other one-bit memory cells adjacent to one-bit memory cells B11 or B41 are correspondingly represented by resistors 390A and 399A. When one column of the one-bit memory cells connecting to the programming gate-strip 220A is selected for programming or for reading, the bit conducting lines 510, 520, 530, and 540 are functioning correspondingly as the bit line BL1 for the one-bit memory cell B11, the bit line BL2 for the one-bit memory cell B21, the bit line BL3 for the one-bit memory cell B31, and the bit line BL4 for the one-bit memory cell B41. The total equivalent resistivity in the conductive path for sensing each one-bit memory cell B21 is equal to $R_{M0/VG}+R_{MG}+R_{cell}+R_{BL}$. Here, $R_{cell}$ is the equivalent cell resistor (such as one of the residual resistors R11, R21, R31, and R41 during the reading mode), and $R_{BL}$ is the equivalent resistance of the bit line (such as one the bit lines BL1, BL2, BL3, and BL4).

Figure 9B:
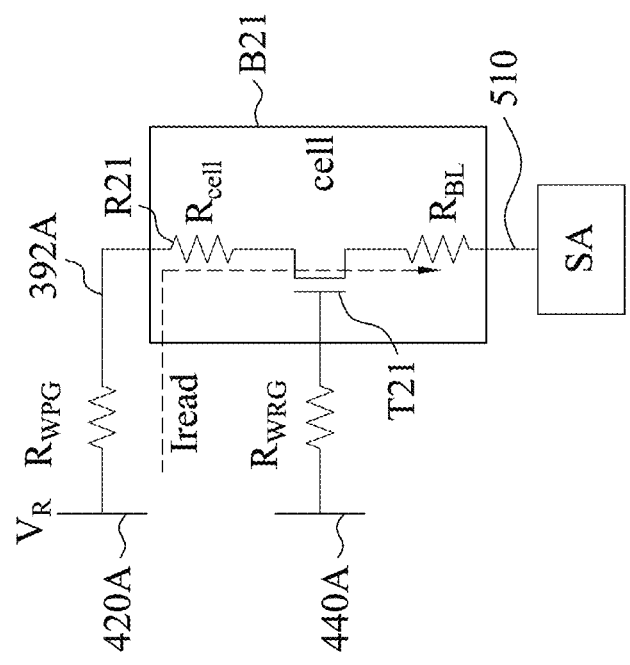
FIG. 9B is an equivalent circuit of the one-bit memory cell in the reading mode, in accordance with some embodiments.

FIG. 9B is an equivalent circuit of the one-bit memory cell B21 in the reading mode while the one-bit memory cell B21 is in connection with the word programming line 420A and the bit conducting line 520, in accordance with some embodiments. In the non-limiting example of FIG. 9B, the read transistor T2A is an NMOS transistor. The gate terminal of the read transistor T2A is conductively connected to the word read line 440A through an equivalent resistor $R_{WRG}$ between the word read line and the gate of the read transistor T2A. The resistive value of the equivalent resistor $R_{WRG}$ depends upon the resistive values of read conducting lines 312 and 334, the conductivity of the read gate-strip 240A, the resistivity of the via-connectors VIA0 (e.g., in FIGS. 6A-6C) between the word read line 440A and read conducting lines 312 and 334, and the resistivity of the via-connectors VG (e.g., in FIGS. 6A-6C) between the read gate-strip 240A and read conducting lines 312 and 334. The source terminal of the read transistor T2A is conductively connected to the sense amplifier SA through the bit conducting line 520. The resistive value of the equivalent resistor $R_{BL}$ between the source terminal of the read transistor T2A and the input of the sense amplifier SA depends upon the resistive value of the bit conducting line 510 and the resistivity of the via-connectors (e.g., VD, VIA0, and VIA1 in FIG. 7C) for connecting the source terminal of the read transistor T2A to the bit conducting line 520.

In FIG. 9B, one terminal of the residual resistors R21 is connected to the drain terminal of the read transistor T2A, and the other terminal of the residual resistors R21 is connected to the word programming line 420A through an equivalent resistor $R_{WPG}$ between the word programming line and the gate of the anti-fuse structures S2A. The resistive value of the equivalent resistor $R_{WPG}$ depends upon the resistive value of each programming conducting line in the group 392A, the number of programming conducting lines in the group 392A, the resistivity of the via-connectors VIA0 (e.g., in FIGS. 6A-6C) between the word programming line 420A and the programming conducting lines, and the resistivity of the via-connectors VG (e.g., in FIGS. 6A-6C) between the programming gate-strip 220A and the programming conducting lines. While the resistive value of the equivalent resistor $R_{WPG}$ may also depends upon the resistivity of the programming gate-strip 220A, the contribution to the resistive value of the equivalent resistor $R_{WPG}$ by the resistivity of the programming gate-strip 220A is negligible in some embodiments. For example, when the layout pattern of each programming conducting line in the group 392B overlaps with the layout pattern of the active zones 252 in the partial layout pattern FIG. 3, in some embodiments, the resistivity of the programming gate-strip 220A in a fabricated device does not significantly impact the resistive value of the equivalent resistor $R_{WPG}$.

When the reading voltage $V_R$ is applied to the word programming line 420A, the induced current $I_{read}$ flowing through the residual resistor R21 is detected by the sense amplifier SA. The induced current $I_{read}$ inversely proportional to the total resistive value due to the equivalent resistor $R_{WPG}$ (between the word programming line 420A and the gate of the anti-fuse structures S2A), the equivalent resistor $R_{BL}$ (between the source terminal of the read transistor T2A and the sense amplifier SA), and the residual resistor R21 of the anti-fuse structures S2A. The sensitivity and the reliability for the sense amplifier SA to discriminate between the HIGH resistive value and the LOW resistive value of the residual resistor R21 depends upon the resistive value of the equivalent resistor $R_{WPG}$ and the resistive value of the equivalent resistor $R_{BL}$. Lowering the resistive value of the equivalent resistor $R_{WPG}$ and/or the resistive value of the equivalent resistor $R_{BL}$ improves the sensitivity and the reliability of the sense amplifier SA for determining a discrete value of the residual resistor R21.

While increasing the number of programming conducting lines in the group 392A reduces the resistive value of the equivalent resistor $R_{WPG}$, increasing the number of programming conducting lines in some circumstances may also increase the size of the one-bit memory cell B21 in certain circumstances. In some embodiments (such as the embodiments in FIGS. 10A-10B, FIGS. 11A-11B, and FIGS. 12A-12B), multiple programming conducting lines are implemented for each one-bit memory cell to connect the gate of an anti-fuse structure (e.g., S2A) to a word programming line (e.g., 420A) while the size of the one-bit memory cell is not significantly increased.

FIG. 10A is a partial layout diagram of a part of a memory circuit having programming conducting lines, bit connectors, and via connectors positioned along with active zones, in accordance with some embodiments. The layout designs of various elements in FIG. 10A are identical to the layout designs of the corresponding elements in FIG. 3. For example, both the programming gate-strip 220A and read gate-strips 240A extends in the Y-direction and intersect each of the active zones 251 and 252. Each of the terminal conductors 261 and 262 extending in the Y-direction correspondingly intersects one of the active zones 251 and 252. Each of the bit connectors 361 and 362 is conductively connected to one of the corresponding terminal conductors 261 and 262 through a terminal via-connector VD. Each of the programming conducting lines in group 391A overlaps with the active zone 251 and is conductively connected to the programming gate-strip 220A through the gate via-connector VG. Each of the programming conducting lines in group 391B overlaps with the active zone 251 and is conductively connected to the programming gate-strip 220B through the gate via-connector VG. Each of the programming conducting lines in group 392A overlaps with the active zone 252 and is conductively connected to the programming gate-strip 220A through the gate via-connector VG. Each of the programming conducting lines in group 392B overlaps with the active zone 252 and is conductively connected to the programming gate-strip 220B through the gate via-connector VG. In FIG. 10A, each group of programming conducting lines includes three programming conducting lines. For example, the group 392A includes programming conducting lines 392A[1], 392A[2], and 392A[3].

In some embodiments, the width of the active zones 251 and 252 as designed is larger than the total width of three or more programming conducting lines if each of the programming conducting line is implemented with a minimal width based on design rule requirements. For example, in some embodiments, the width of the active zones 251 and 252 are optimized based upon performance requirements, such as, speeds and power consumptions. If the outer edge-to-edge distance of each group of programming conducting lines is less than the width of the active zones, the size of the one-bit memory cell is not impacted by the multiple programming conducting lines in the group. For example, in FIG. 10A, if the distance WC between 392A[1] and 392A[3] measured from outer edge to outer edge is not larger than the width WA of the active zone 252, the mere implementation of three programming conducting lines in the group 392A does not increase the size of the one-bit memory cell (which is B21 in FIG. 8A). In some circumstances, even if the distance WC between 392A[1] and 392A[3] is larger than the width WA of the active zone 252, some embodiments of the programming conducting lines are considered to be acceptable in terms of the impacts to the size of the one-bit memory cell. In some embodiments, even if the distance WC is larger than the width WA, each of the programming conducting lines in the group 392A still overlaps with the active zone 252. In some embodiments, even if the distance WC is larger than the width WA, each of the gate via-connector VG for connecting the programming gate-strip 220A with one of the programming conducting lines in the group 392A is still within the active zone 252.

While each of the programming conducting lines in FIG. 10A is connected to a programming gate-strip through a corresponding gate via-connector VG, the connection between each group of programming conducting lines and the programming gate-strip, in alternative embodiments, may include at least one extended via-connector. FIG. 10B is a partial layout diagram of a part of a memory circuit having extended via-connectors, based on a modification of the partial layout diagram in FIG. 10A, in accordance with some embodiments. The layout designs in FIG. 10B are similar to that in FIG. 10A, except that the multiple gate via-connectors VG for connecting each group of programming conducting lines to a programming gate-strip are substituted with one extended via-connector. The extended via-connectors 1051A and 1052A correspondingly connect the programming conducting lines in the group 391A and the group 392A to the programming gate-strip 220A. The extended via-connectors 1051B and 1052B correspondingly connect the programming conducting lines in the group 391B and the group 392B to the programming gate-strip 220B. In some embodiments, the length of an extended via-connector along the Y-direction is selected to be sufficiently large to connect all programming conducting lines in one group for a one-bit memory cell to a programming gate-strip. For example, the length of the extended via-connector 1052A is designed to connect all programming conducting lines 392A[1], 392A[2], and 392A[3] in the group 392A to the programming gate-strip 220A. In some embodiments, the width of an extended via-connector along the X-direction is selected to be maximized without violations of the design rules.

In contrast to the embodiments in FIG. 10A in which multiple programming conducting lines are used for connecting a programming gate-strip to a word programming line (e.g., 420A in FIG. 6A), in alternative embodiments, a merged programming conducting line is used for connecting a programming gate-strip to a word programming line. FIG. 10C is a partial layout diagram of a part of a memory circuit having merged programming conducting lines, based on a modification of the partial layout diagram in FIG. 10A, in accordance with some embodiments. The layout designs in FIG. 10C are similar to that in FIG. 10A, except that each group of programming conducting lines in FIG. 10A is substituted with a merged programming conducting line. Each of the merged programming conducting lines 1091A, 1092A, 1091B, and 1092B in FIG. 10C correspondingly replaces one of the groups 391A, 392A, 391B, 392B of programming conducting lines in FIG. 10A. In some embodiments, the width WM of a merged programming conducting line is less than or equal to the width WA of the active zone. In some embodiments, while the width WM of a merged programming conducting line is larger than the width WA of the active zone, the width WM of a merged programming conducting line is selected to be maximized within the limit constrained by the design rules. If two merged programming conducting lines are adjacent to each other and the width WM of each of the two merged programming conducting lines is too large, then, in certain circumstances, the edge-to-edge distance between the two adjacent lines may violate the design rules. Consequently, the possible width WM of a merged programming conducting line has a maximum limit.

Figure 10D:
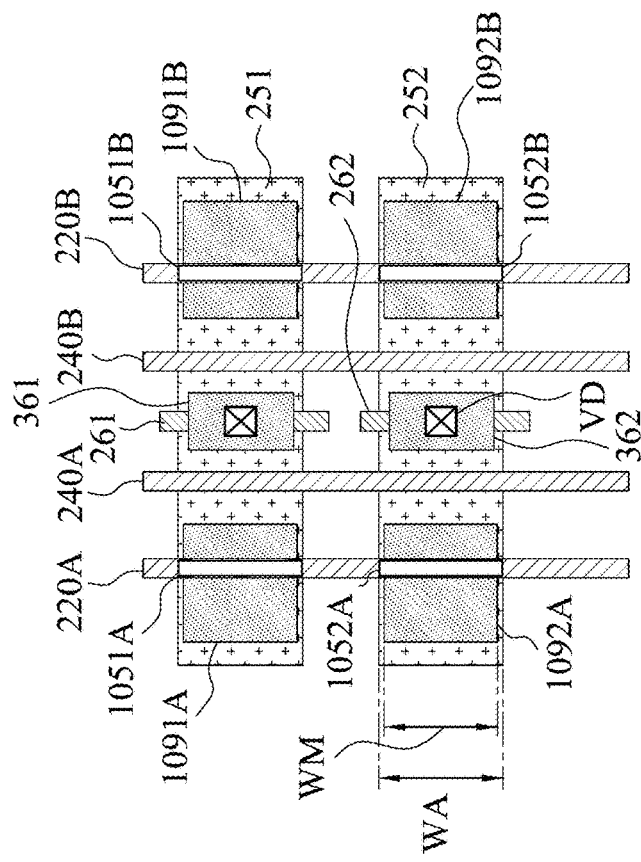
FIG. 10D is a partial layout diagram of a part of a memory circuit having extended via-connectors and merged programming conducting lines, based on a modification of FIG. 10C, in accordance with some embodiments.
Figure 10C:
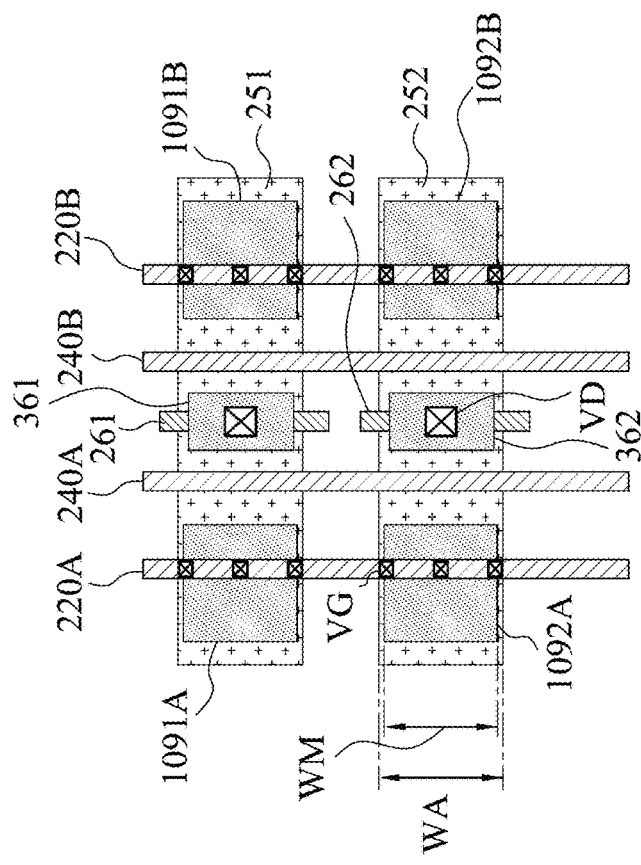
FIG. 10C is a partial layout diagram of a part of a memory circuit having merged programming conducting lines, based on a modification of FIG. 10A, in accordance with some embodiments.
Figure 11B:
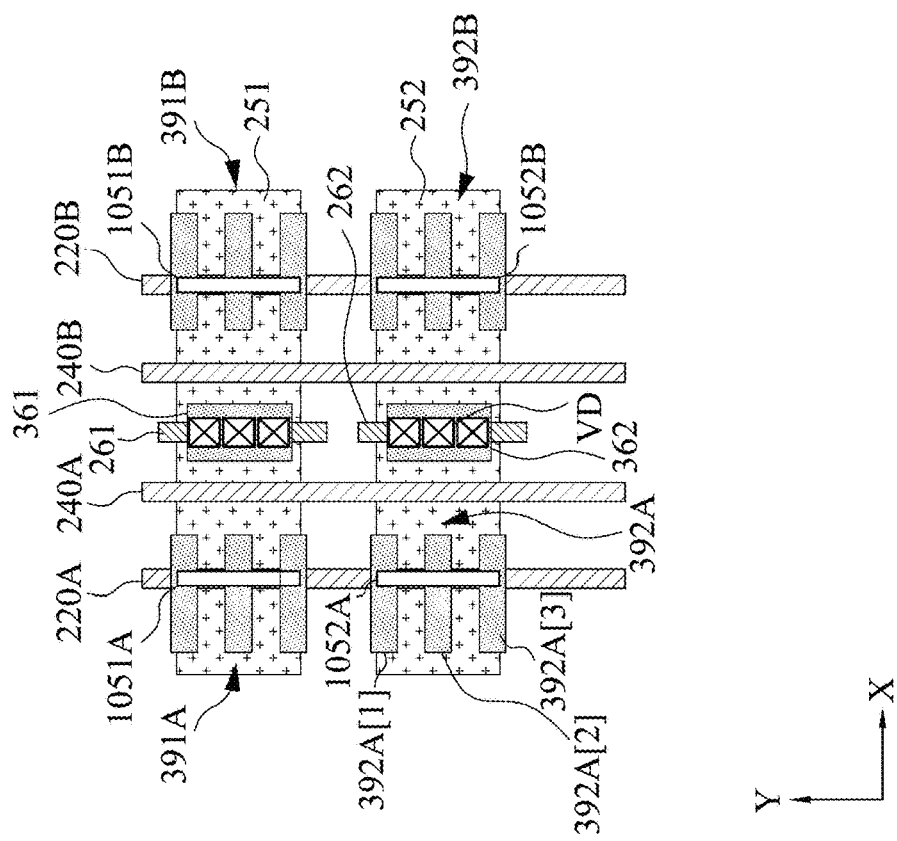
FIGS. 11A-11D are partial layout diagrams having multiple terminal via-connectors, based on modifications of FIGS. 10A-10D, in accordance with some embodiments.
Figure 11A:
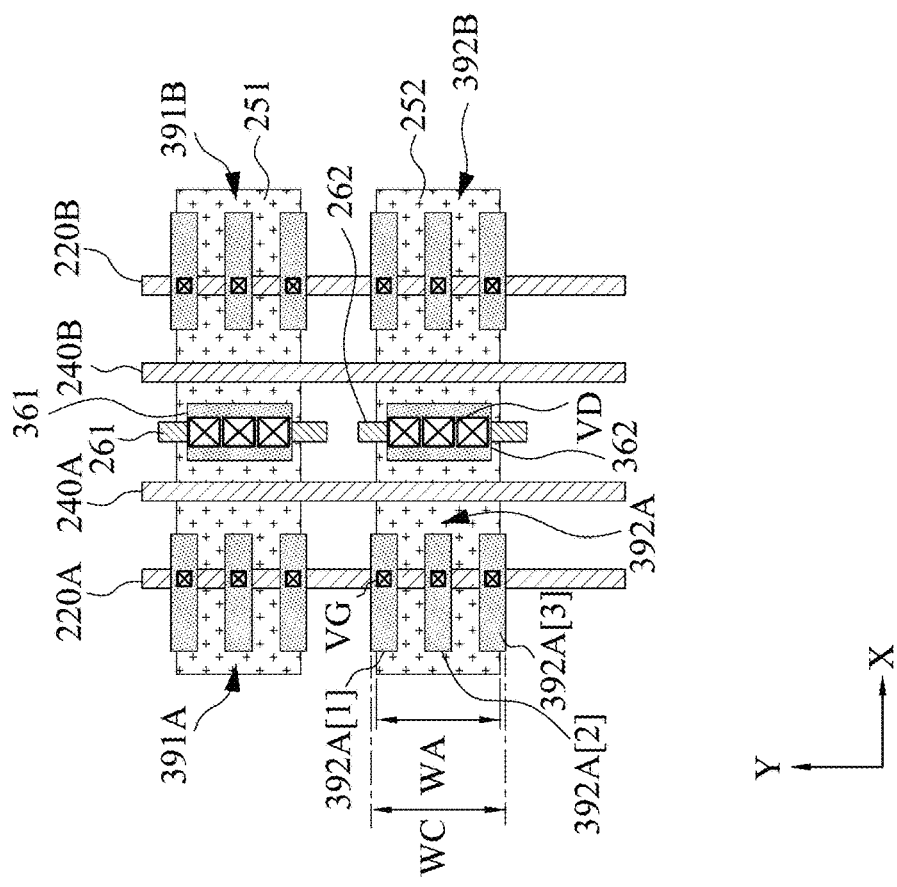
Figure 11D:
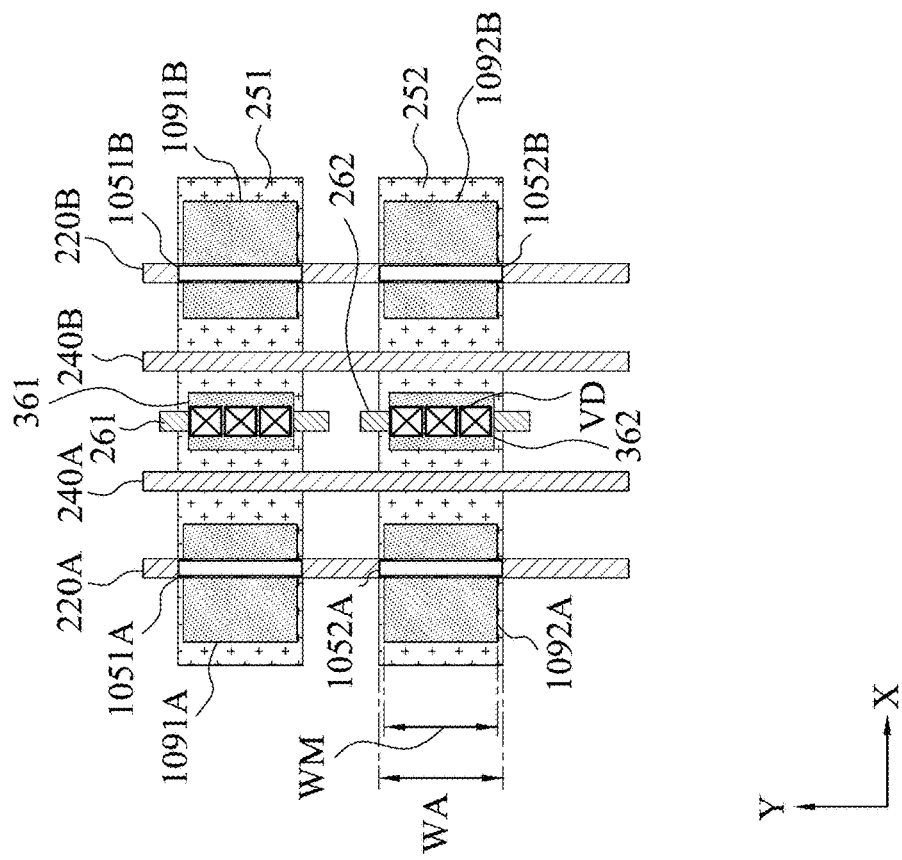
Figure 11C:
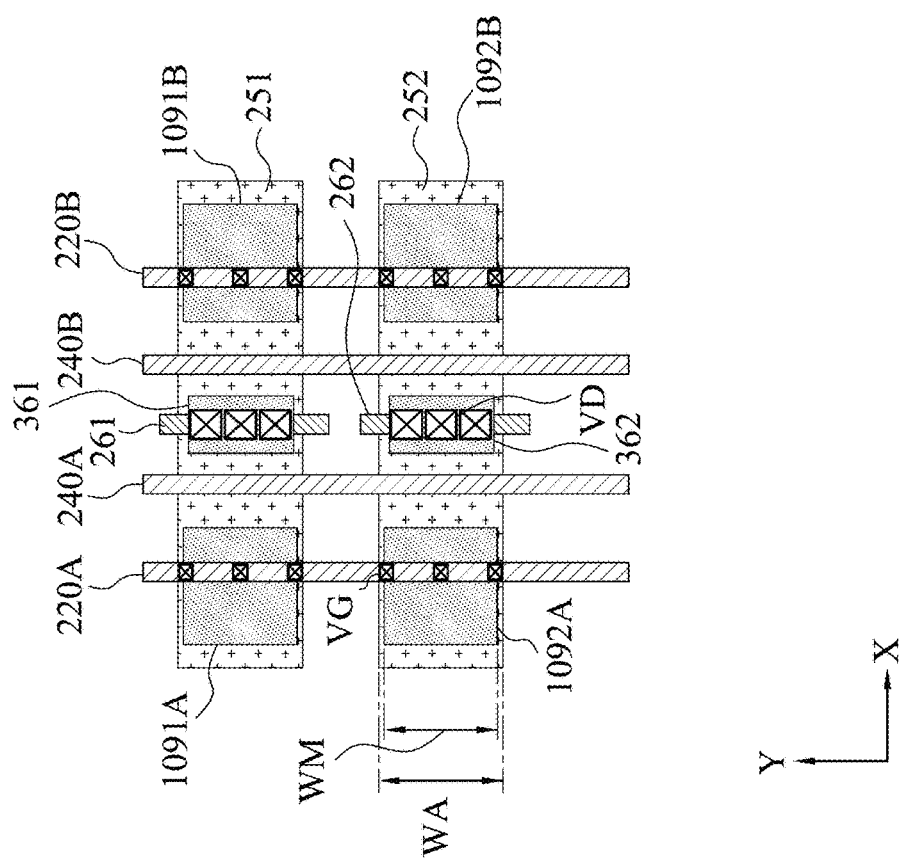
Figure 12B:
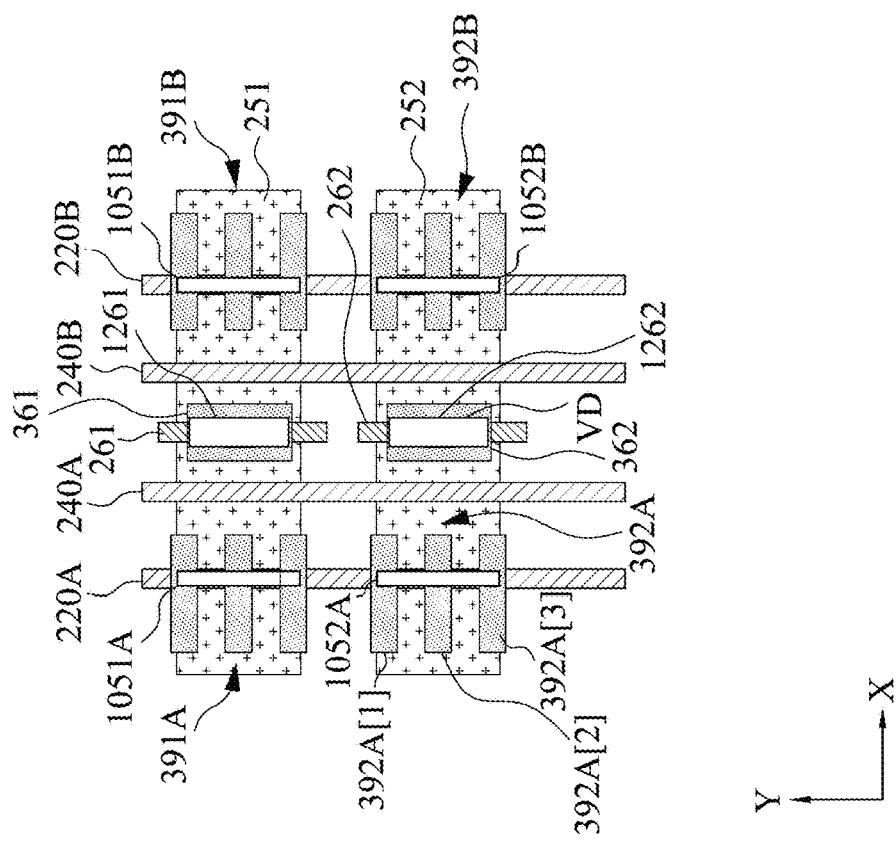
FIGS. 12A-12D are partial layout diagrams having extended terminal via-connectors, based on modifications of FIGS. 10A-10D, in accordance with some embodiments.
Figure 12A:
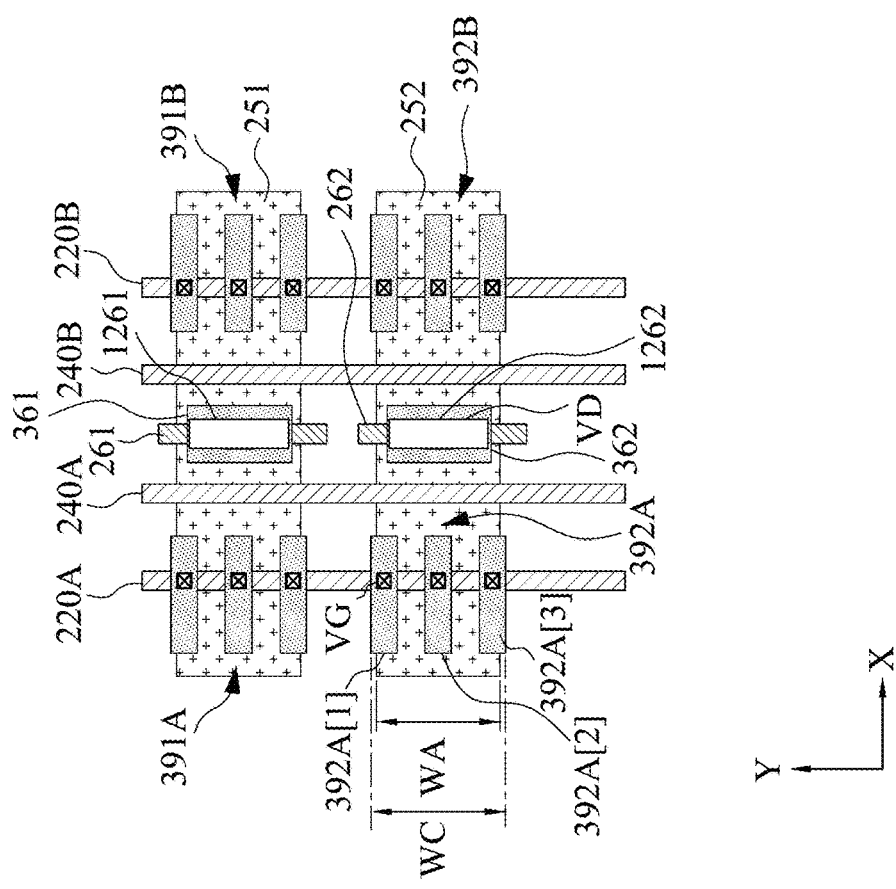
Figure 12D:
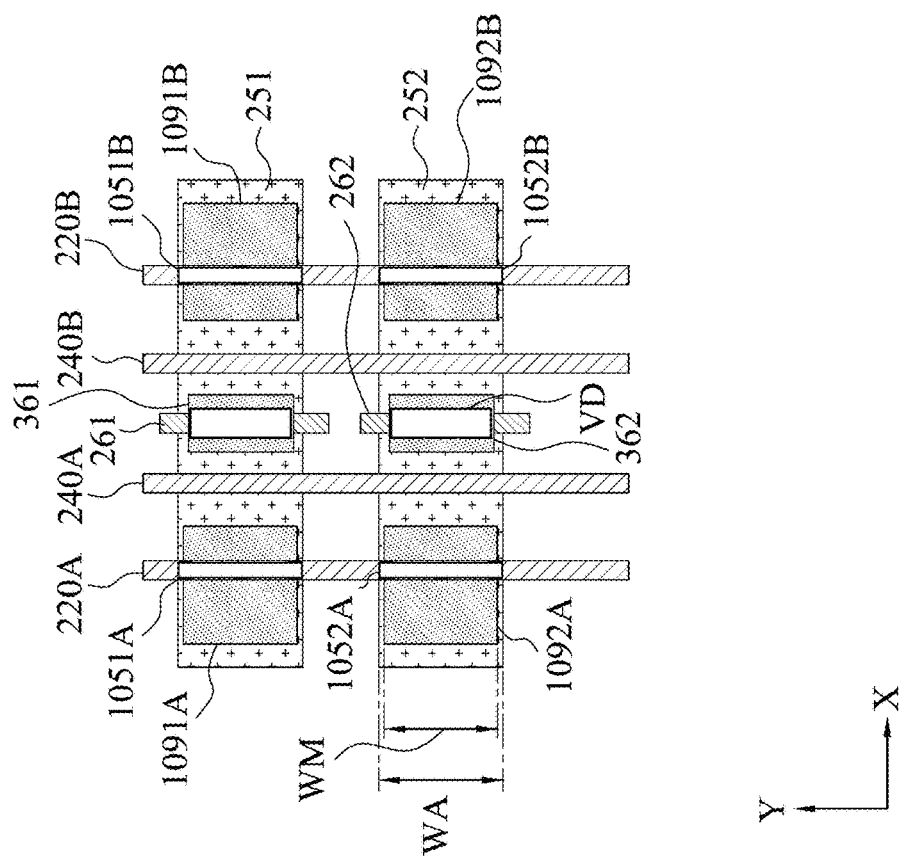
Figure 12C:
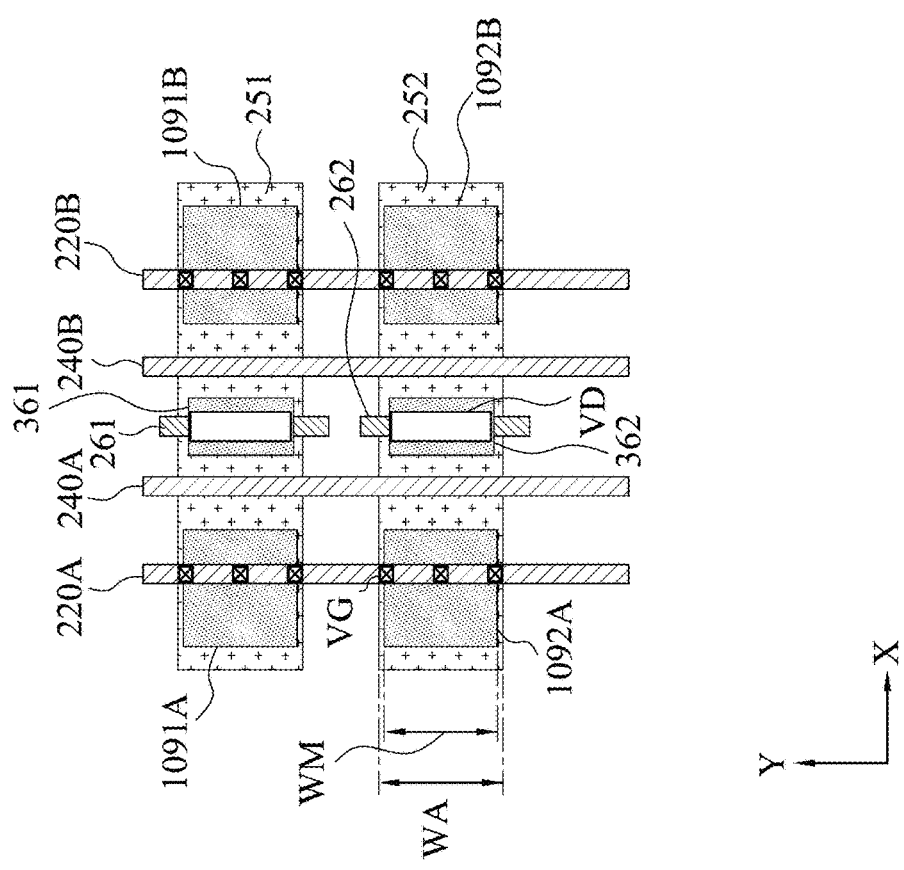

In still alternative embodiments, the layout designs of FIG. 10D include both the extended via-connectors and the merged programming conducting lines. FIG. 10D is a partial layout diagram of a part of a memory circuit based on a modification of the partial layout diagram in FIG. having merged programming conducting lines, in accordance with some embodiments. In FIG. 10D, each of the merged programming conducting lines 1091A and 1092A is correspondingly connected to the programming gate-strip 220A though one of the extended via-connectors 1051A and 1052A. Each of the merged programming conducting lines 1091B and 1092B is correspondingly connected to the programming gate-strip 220B though one of the extended via-connectors 1051B and 1052B.

In addition to reducing the resistive value of the equivalent resistor $R_{WPG}$ between a word programming line and the gate of an anti-fuse structure, reducing the equivalent resistor $R_{BL}$ between the source terminal of the read transistor and the sense amplifier may further improve the sensitivity and the reliability for the sense amplifier to determine a discrete value of the residual resistor in a one-bit memory cell. In some embodiments, each of the bit connectors in a memory device is conductively connected to one corresponding terminal conductor through multiple terminal via-connectors VD. In some embodiments, each of the bit connectors in a memory device is conductively connected to one corresponding terminal conductor through an extended terminal via-connector.

FIGS. 11A-11D are partial layout diagrams based on modifications of the partial layout diagram in FIGS. 10A-10D, in accordance with some embodiments. Each of the partial layout diagrams in FIGS. 11A-11D specifies a part of a memory circuit having multiple terminal via-connectors between each bit connector and a corresponding terminal conductor. The layout designs in each of FIGS. 11A-11D are correspondingly similar to that in FIGS. 10A-10D, except that each terminal via-connector in FIGS. 10A-10D is substituted with multiple terminal via-connectors VD. In some embodiments, the number of the terminal via-connectors VD between each bit connector and the corresponding terminal conductor is maximized within the limit constrained by the design rules.

FIGS. 12A-12D are partial layout diagrams based on modifications of the partial layout diagram in FIGS. 10A-10D, in accordance with some embodiments. Each of the partial layout diagrams in FIGS. 12A-12D specifies a part of a memory circuit having an extended terminal via-connector between each bit connector and a corresponding terminal conductor. The layout designs in FIGS. 12A-12D are correspondingly similar to that in FIGS. 10A-10D, except that each terminal via-connector in FIGS. 10A-10D is substituted with an extended terminal via-connector. The extended terminal via-connector 1261 in FIGS. 12A-12D replaces the terminal via-connector VD between the bit connector 361 and the terminal conductor 261 in FIGS. 10A-10D. The extended terminal via-connector 1262 in FIGS. 12A-12D replaces the terminal via-connector VD between the bit connector 362 and the terminal conductor 262 in FIGS. 10A-10D. An extended terminal via-connectors has an aspect ratio that is the ratio between the length of the extended terminal via-connector extending in the Y-direction and the width of the extended terminal via-connector extending in the X-direction. Generally, the aspect ratio of each of the extended terminal via-connectors 1261 and 1262 is larger than or equal to 2.0. In some embodiments, the aspect ratio of each of the extended terminal via-connectors 1261 and 1262 is maximized to the extent permitted by the design rules. In some embodiments, the length of each extended terminal via-connector (1261 or 1262) is larger than or equal to the width WA of the corresponding active zone (251 or 252). In some embodiments, the length of each extended terminal via-connector (1261 or 1262) is larger than or equal to the width WA but smaller than the length of the terminal conductor (261 or 262) extending in the Y-direction.

Figure 13:
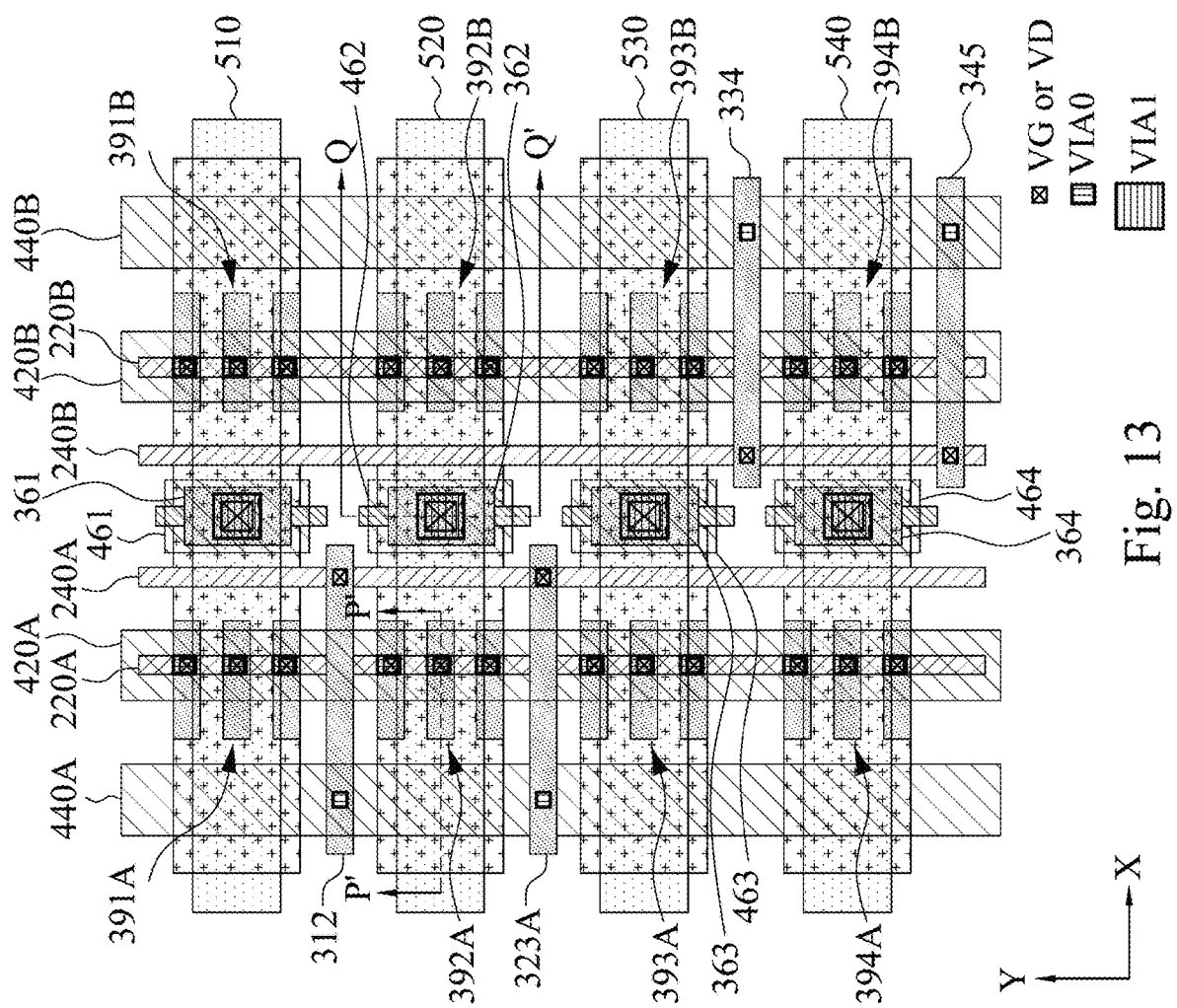
FIG. 13 is a partial layout diagram based on a modification of the partial layout diagram in FIG. 5A, in accordance with some embodiments.

In FIGS. 10A-10D, 11A-11D, and 12A-12D, the layout designs are modified for at least some of the programming conducting lines, the gate via-connectors, the terminal via-connectors in the partial layout diagrams of FIG. 5A or FIG. 7A. In alternative embodiments, layout modifications of other elements are possible. For example, in some embodiments, the layout designs of the read conducting lines are modified. FIG. 13 is a partial layout diagram based on a modification of the partial layout diagram in FIG. 5A, in accordance with some embodiments. The layout designs in FIG. 13 are similar to that in FIG. 5A, except that the positions of the read conducting lines are shifted along the Y-direction. The read conducting line 334 in FIG. 5A is substituted with the read conducting line 323A in FIG. 13. The read conducting line 323 in FIG. 5A (or FIG. 7A) is substituted with the read conducting line 334B in FIG. 13.

Figure 14:
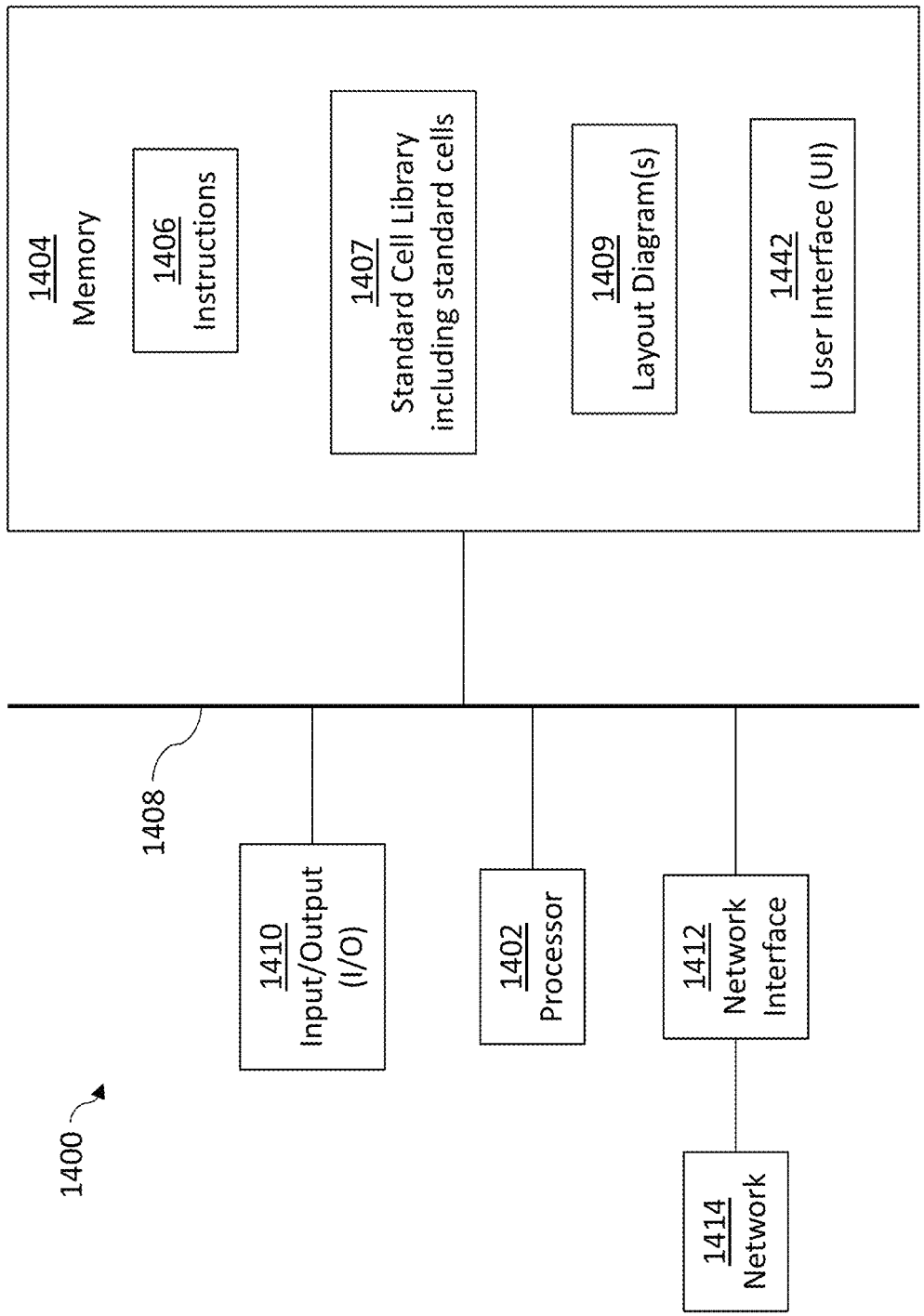
FIG. 14 is a block diagram of an electronic design automation (EDA) system in accordance with some embodiments.

FIG. 14 is a block diagram of an electronic design automation (EDA) system 1400 in accordance with some embodiments.

In some embodiments, EDA system 1400 includes an APR system. Methods described herein of designing layout diagrams represent wire routing arrangements, in accordance with one or more embodiments, are implementable, for example, using EDA system 1400, in accordance with some embodiments.

In some embodiments, EDA system 1400 is a general purpose computing device including a hardware processor 1402 and a non-transitory, computer-readable storage medium 1404. Storage medium 1404, amongst other things, is encoded with, i.e., stores, computer program code 1406, i.e., a set of executable instructions. Execution of instructions 1406 by hardware processor 1402 represents (at least in part) an EDA tool which implements a portion or all of the methods described herein in accordance with one or more embodiments (hereinafter, the noted processes and/or methods).

Processor 1402 is electrically coupled to computer-readable storage medium 1404 via a bus 1408. Processor 1402 is also electrically coupled to an I/O interface 1410 by bus 1408. A network interface 1412 is also electrically connected to processor 1402 via bus 1408. Network interface 1412 is connected to a network 1414, so that processor 1402 and computer-readable storage medium 1404 are capable of connecting to external elements via network 1414. Processor 1402 is configured to execute computer program code 1406 encoded in computer-readable storage medium 1404 in order to cause system 1400 to be usable for performing a portion or all of the noted processes and/or methods. In one or more embodiments, processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores library 1407 of standard cells including such standard cells as disclosed herein. In one or more embodiments, storage medium 1404 stores one or more layout diagrams 1409 corresponding to one or more layouts disclosed herein.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1402.

EDA system 1400 also includes network interface 1412 coupled to processor 1402. Network interface 1412 allows system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1400.

System 1400 is configured to receive information through I/O interface 1410. The information received through I/O interface 1410 includes one or more of instructions, data, design rules, libraries of standard cells, and/or other parameters for processing by processor 1402. The information is transferred to processor 1402 via bus 1408. EDA system 1400 is configured to receive information related to a UI through I/O interface 1410. The information is stored in computer-readable medium 1404 as user interface (UI) 1442.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 15:
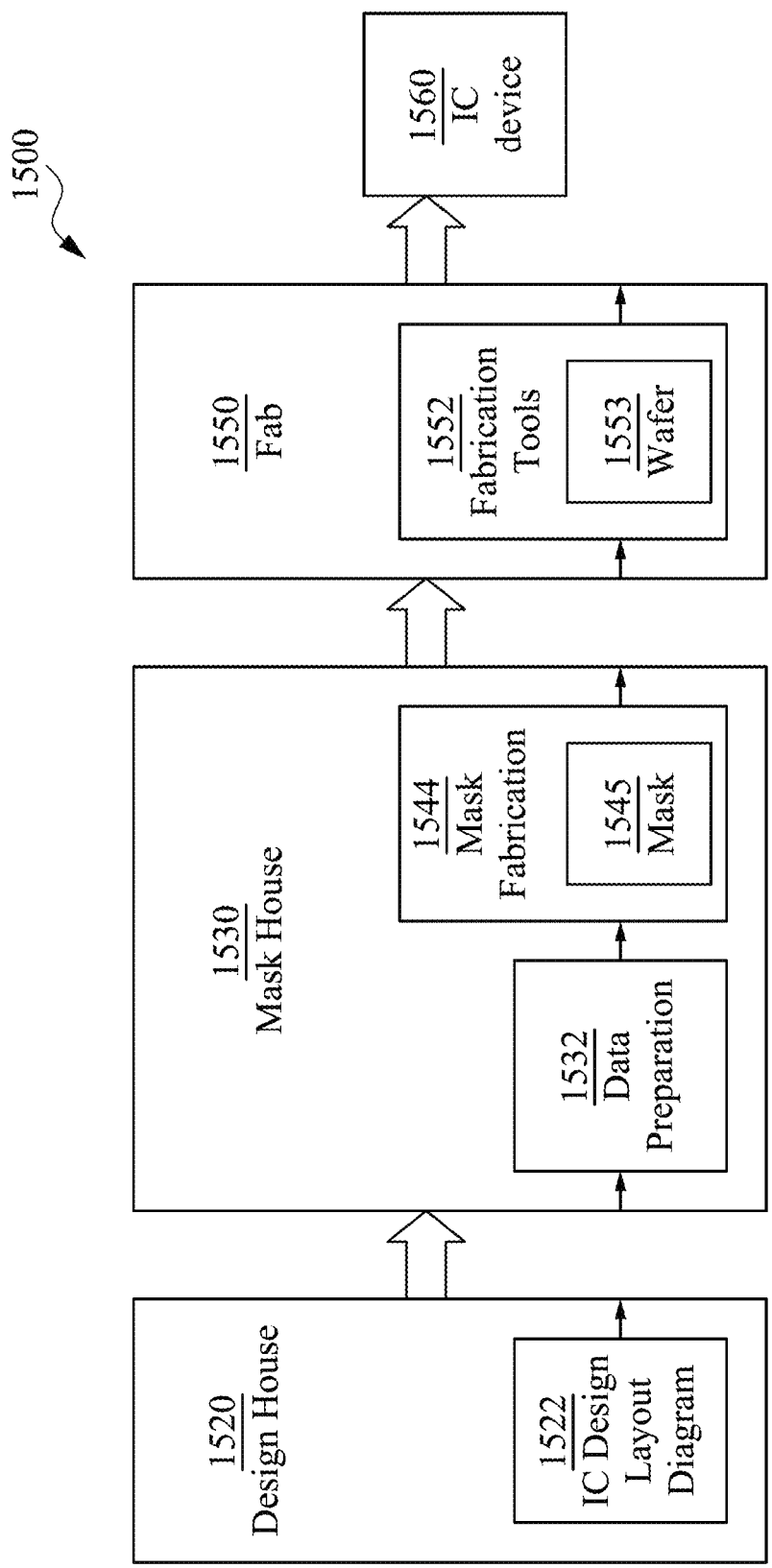
FIG. 15 is a block diagram of an integrated circuit (IC) manufacturing system, and an IC manufacturing flow associated therewith, in accordance with some embodiments.

FIG. 15 is a block diagram of an integrated circuit (IC) manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The design layout diagram 1522 is manipulated by mask data preparation 1532 to comply with particular characteristics of the mask writer and/or requirements of IC fab 1550. In FIG. 15, mask data preparation 1532 and mask fabrication 1544 are illustrated as separate elements. In some embodiments, mask data preparation 1532 and mask fabrication 1544 can be collectively referred to as mask data preparation.

In some embodiments, mask data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, mask data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of mask data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 may be executed in a variety of different orders.

After mask data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1545 includes a transparent substrate (e.g., fused quartz) and an opaque material (e.g., chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 is an IC fabrication business that includes one or more manufacturing facilities for the fabrication of a variety of different IC products. In some embodiments, IC Fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1550 includes fabrication tools 1552 configured to execute various manufacturing operations on semiconductor wafer 1553 such that IC device 1560 is fabricated in accordance with the mask(s), e.g., mask 1545. In various embodiments, fabrication tools 1552 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

Details regarding an integrated circuit (IC) manufacturing system (e.g., system 1500 of FIG. 15), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to a memory device. The memory device includes a first programming gate-strip and a second programming gate-strip both extending in a second direction perpendicular to a first direction, a first anti-fuse structure having a first dielectric layer overlying a first semiconductor region in an active zone at an intersection of the first programming gate-strip and the active zone extending in the first direction, and a second anti-fuse structure having a second dielectric layer overlying a second semiconductor region in the active zone at an intersection of the second programming gate-strip and the active zone. The memory device also includes a first transistor having a first channel region in the active zone, a second transistor having a second channel region in the active zone, and a terminal conductor overlying a terminal region in the active zone between the first channel region of the first transistor and the second channel region of the second transistor. The memory device further includes a group of first programming conducting lines extending in the first direction, and a group of second programming conducting lines extending in the first direction. The first programming conducting lines are conductively connected to the first programming gate-strip through a first group of one or more gate via-connectors. The second programming conducting lines are conductively connected to the second programming gate-strip through a second group of one or more gate via-connectors.

Another aspect of the present disclosure also relates to a memory device. The memory device includes a first programming gate-strip and a second programming gate-strip both extending in a second direction perpendicular to a first direction, and includes also a first read gate-strip and a second read gate-strip, both extending in the second direction, positioned between the first programming gate-strip and the second programming gate-strip. The memory device further includes a first anti-fuse structure, a first transistor, a second anti-fuse structure, a second transistor, a terminal conductor, a group of first programming conducting lines, a group of second programming conducting lines, and a bit connector. The first anti-fuse structure has a first dielectric layer overlying a first semiconductor region in an active zone at an intersection of the first programming gate-strip and the active zone extending in the first direction. The first transistor has a first channel region in the active zone at an intersection of the first read gate-strip and the active zone. The second anti-fuse structure has a second dielectric layer overlying a second semiconductor region in the active zone at an intersection of the second programming gate-strip and the active zone. The second transistor has a second channel region in the active zone at an intersection of the second read gate-strip and the active zone. The terminal conductor overlies a terminal region in the active zone between the first channel region of the first transistor and the second channel region of the second transistor. The group of first programming conducting lines, extending in the first direction, is conductively connected to the first programming gate-strip through a first group of one or more gate via-connectors. The group of second programming conducting lines, extending in the first direction, is conductively connected to the second programming gate-strip through a second group of one or more gate via-connectors. The bit connector is conductively connected to the terminal conductor through one or more terminal via-connectors.

Another aspect of the present disclosure still relates to a memory device. The memory device includes a first programming gate-strip and a second programming gate-strip both extending in a second direction perpendicular to a first direction, and the memory device includes a first read gate-strip and a second read gate-strip, both extending in the second direction, positioned between the first programming gate-strip and the second programming gate-strip. The memory device also includes a first anti-fuse structure having a first dielectric layer overlying a first semiconductor region in an active zone at an intersection of the first programming gate-strip and the active zone extending in the first direction, and a second anti-fuse structure having a second dielectric layer overlying a second semiconductor region in the active zone at an intersection of the second programming gate-strip and the active zone. The memory device further includes a first transistor having a first channel region in the active zone at an intersection of the first read gate-strip and the active zone, a second transistor having a second channel region in the active zone at an intersection of the second read gate-strip and the active zone, and a terminal conductor overlying a terminal region in the active zone between the first channel region of the first transistor and the second channel region of the second transistor. The memory device further includes a group of first programming conducting lines extending in the first direction, a group of second programming conducting lines, extending in the first direction, a first word programming line, extending in the second direction, and a second word programming line, extending in the second direction. The first programming conducting lines are conductively connected to the first programming gate-strip through a first group of one or more gate via-connectors. The second programming conducting lines are conductively connected to the second programming gate-strip through a second group of one or more gate via-connectors. The first word programming line is conductively connected to the group of first programming conducting lines. The second word programming line is conductively connected to the group of second programming conducting lines.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory device comprising:
   a first programming gate-strip and a second programming gate-strip both extending in a second direction perpendicular to a first direction;
   a first anti-fuse structure having a first dielectric layer overlying a first semiconductor region in an active zone at an intersection of the first programming gate-strip and the active zone extending in the first direction;
   a first transistor having a first channel region in the active zone;
   a second anti-fuse structure having a second dielectric layer overlying a second semiconductor region in the active zone at an intersection of the second programming gate-strip and the active zone;
   a second transistor having a second channel region in the active zone;
   a terminal conductor overlying a terminal region in the active zone between the first channel region of the first transistor and the second channel region of the second transistor;
   a group of first programming conducting lines, extending in the first direction, conductively connected to the first programming gate-strip through a first group of one or more gate via-connectors; and
   a group of second programming conducting lines, extending in the first direction, conductively connected to the second programming gate-strip through a second group of one or more gate via-connectors.

2. The memory device of claim 1, wherein the first channel region is between the first semiconductor region and the terminal region, and the second channel region is between the second semiconductor region and the terminal region.

3. The memory device of claim 1, comprising:
   a first word programming line, extending in the second direction, conductively connected to the group of first programming conducting lines; and
   a second word programming line, extending in the second direction, conductively connected to the group of second programming conducting lines.

4. The memory device of claim 1, comprising:
   a bit connector conductively connected to the terminal conductor through one or more terminal via-connectors.

5. The memory device of claim 4, comprising:
   a bit conducting line, extending in the first direction, conductively connected to the bit connector.

6. The memory device of claim 1, comprising:
   a first read gate-strip and a second read gate-strip, both extending in the second direction, positioned between the first programming gate-strip and the second programming gate-strip.

7. The memory device of claim 6, further comprising:
   a first read conducting line, extending in the first direction, conductively connected to the first read gate-strip; and
   a second read conducting line, extending in the first direction, conductively connected to the second read gate-strip.

8. The memory device of claim 7, further comprising:
   a first word read line, extending in the second direction, conductively connected to the first read conducting line; and
   a second word read line, extending in the second direction, conductively connected to the second read conducting line.

9. The memory device of claim 8, wherein the first read gate-strip and the second read gate-strip are parallelly positioned between the first word read line and the second word read line.

10. A memory device comprising:
    a first programming gate-strip and a second programming gate-strip both extending in a second direction perpendicular to a first direction;
    a first read gate-strip and a second read gate-strip, both extending in the second direction, positioned between the first programming gate-strip and the second programming gate-strip;
    a first anti-fuse structure having a first dielectric layer overlying a first semiconductor region in an active zone at an intersection of the first programming gate-strip and the active zone extending in the first direction;
    a first transistor having a first channel region in the active zone at an intersection of the first read gate-strip and the active zone;
    a second anti-fuse structure having a second dielectric layer overlying a second semiconductor region in the active zone at an intersection of the second programming gate-strip and the active zone;
    a second transistor having a second channel region in the active zone at an intersection of the second read gate-strip and the active zone;
    a terminal conductor overlying a terminal region in the active zone between the first channel region of the first transistor and the second channel region of the second transistor;
    a group of first programming conducting lines, extending in the first direction, conductively connected to the first programming gate-strip through a first group of one or more gate via-connectors;
    a group of second programming conducting lines, extending in the first direction, conductively connected to the second programming gate-strip through a second group of one or more gate via-connectors; and a bit connector conductively connected to the terminal conductor through one or more terminal via-connectors.

11. The memory device of claim 10, comprising:
a first word programming line, extending in the second direction, conductively connected to the group of first programming conducting lines; and
a second word programming line, extending in the second direction, conductively connected to the group of second programming conducting lines.

12. The memory device of claim 10, comprising:
a bit conducting line, extending in the first direction, conductively connected to the bit connector.

13. The memory device of claim 10, comprising:
a first read conducting line, extending in the first direction, conductively connected to the first read gate-strip; and
a second read conducting line, extending in the first direction, conductively connected to the second read gate-strip.

14. The memory device of claim 13, further comprising:
a first word read line, extending in the second direction, conductively connected to the first read conducting line; and
a second word read line, extending in the second direction, conductively connected to the second read conducting line.

15. The memory device of claim 14, wherein the first read gate-strip and the second read gate-strip are parallelly positioned between the first word read line and the second word read line.

16. A memory device comprising:
a first programming gate-strip and a second programming gate-strip both extending in a second direction perpendicular to a first direction;
a first read gate-strip and a second read gate-strip, both extending in the second direction, positioned between the first programming gate-strip and the second programming gate-strip;
a first anti-fuse structure having a first dielectric layer overlying a first semiconductor region in an active zone at an intersection of the first programming gate-strip and the active zone extending in the first direction;
a first transistor having a first channel region in the active zone at an intersection of the first read gate-strip and the active zone;
a second anti-fuse structure having a second dielectric layer overlying a second semiconductor region in the active zone at an intersection of the second programming gate-strip and the active zone;
a second transistor having a second channel region in the active zone at an intersection of the second read gate-strip and the active zone;
a terminal conductor overlying a terminal region in the active zone between the first channel region of the first transistor and the second channel region of the second transistor;
a group of first programming conducting lines, extending in the first direction, conductively connected to the first programming gate-strip through a first group of one or more gate via-connectors;
a group of second programming conducting lines, extending in the first direction, conductively connected to the second programming gate-strip through a second group of one or more gate via-connectors;
a first word programming line, extending in the second direction, conductively connected to the group of first programming conducting lines; and
a second word programming line, extending in the second direction, conductively connected to the group of second programming conducting lines.

17. The memory device of claim 16, comprising:
a bit connector conductively connected to the terminal conductor through one or more terminal via-connectors.

18. The memory device of claim 17, further comprising:
a bit conducting line, extending in the first direction, conductively connected to the bit connector.

19. The memory device of claim 16, comprising:
a first read conducting line, extending in the first direction, conductively connected to the first read gate-strip; and
a second read conducting line, extending in the first direction, conductively connected to the second read gate-strip.

20. The memory device of claim 19, further comprising:
a first word read line, extending in the second direction, conductively connected to the first read conducting line; and
a second word read line, extending in the second direction, conductively connected to the second read conducting line.

21. The memory device of claim 20, wherein the first read gate-strip and the second read gate-strip are parallelly positioned between the first word read line and the second word read line.

* * * * *